(12) United States Patent
Eom et al.

(10) Patent No.: US 11,879,185 B2
(45) Date of Patent: Jan. 23, 2024

(54) LOW-DEFECT-DENSITY GAMMA PHASE ALUMINUM OXIDE SUBSTRATES FOR HETEROEPITAXIAL SYNTHESIS

(71) Applicant: Wisconsin Alumni Research Foundation, Madison, WI (US)

(72) Inventors: Chang-Beom Eom, Madison, WI (US); Rui Liu, Madison, WI (US); Paul Gregory Evans, Madison, WI (US); Donald E. Savage, Madison, WI (US); Thomas Francis Kuech, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 103 days.

(21) Appl. No.: 17/544,298

(22) Filed: Dec. 7, 2021

(65) Prior Publication Data

US 2023/0175169 A1 Jun. 8, 2023

(51) Int. Cl.
*C30B 29/20* (2006.01)
*C23C 16/40* (2006.01)
*C30B 1/02* (2006.01)

(52) U.S. Cl.
CPC ............ *C30B 29/20* (2013.01); *C23C 16/403* (2013.01); *C30B 1/023* (2013.01)

(58) Field of Classification Search
CPC ........ C30B 29/20; C30B 1/023; C23C 16/403
See application file for complete search history.

(56) References Cited

PUBLICATIONS

Hong et al "High-quality thin single-crystal—Al2O3 films grown on Si „111 . . . " Applied Physics letters 87 2005.*
Tanner et al "Structural properties of epitaxial—Al2O3 „111 . . . thin films on 4H—SiC „0001 . . . " Applied Physics Letters 90 2007.*
Evans et al., "Crystallization of amorphous complex oxides: new geometries and new compositions via solid phase epitaxy," https://www.sciencedirectcom/science/article/pii/S1359028618300949, 2018.
Merckling et al., "Development of robust interfaces based on crystalline $Al_2O_3$ (001) for subsequent deposition of amorphous high-k oxides," *Microelectronic Engineering* 84 (2007) 2243-2246.

(Continued)

*Primary Examiner* — Robert M Kunemund
(74) *Attorney, Agent, or Firm* — Bell & Manning, LLC

(57) ABSTRACT

Aluminum oxide ($Al_2O_3$) thin films having a high γ-phase purity and low defect density and methods for making the aluminum oxide thin films are provided. Also provided are epitaxial heterostructures that incorporate the aluminum oxide thin films as growth substrates and methods of forming the heterostructures. The $Al_2O_3$ films are pure, or nearly pure, γ-$Al_2O_3$. As such, the films contain no, or only a very low concentration of, other $Al_2O_3$ polymorph phases. In particular, the $Al_2O_3$ films contain no, or only a very low concentration of, the θ-$Al_2O_3$ polymorph phase.

19 Claims, 11 Drawing Sheets

(56) References Cited

PUBLICATIONS

Liu, Rui, et al. "Phase Selection and Structure of Low-Defect-Density γ- $Al_2O_3$ Created by Epitaxial Crystallization of Amorphous Al2O3." *ACS Applied Materials & Interfaces* (2020).

Jang, Jeonghwan, et al. "Solid-Phase Epitaxial Growth of an Alumina Layer Having a Stacking-Mismatched Domain Structure of the Intermediate γ-Phase." ACS applied materials & interfaces 10.48 (2018): 41487-41496.

Sklad, P. S., et al. "The amorphous-to-gamma transformation in ion implanted $Al_2O_3$." Nuclear Instruments and Methods in Physics Research Section B: Beam Interactions with Materials and Atoms 46.1-4 (1990): 102-106.

McCallum, J. C., T. W. Simpson, and I. V. Mitchell. "Time resolved reflectivity measurements of the amorphous-to-gamma and gamma-to-alpha phase transitions in ion-implanted $Al_2O_3$." Nuclear Instruments and Methods in Physics Research Section B: Beam Interactions with Materials and Atoms 91.1-4 (1994): 60-62.

Simpson, Todd W., et al. "Kinetics of the amorphous γ→ α transformations in aluminum oxide: effect of crystallographic orientation." Journal of the American Ceramic Society 81.1 (1998): 61-66.

Levin, I., et al. "Cubic to monoclinic phase transformations in alumina." Acta Materialia 45.9 (1997): 3659-3669.

Wu et al., High quality thin single-crystal $Al_2O_3$ films grown on Si (111) *Appl. Phys. Lett.* 87, 091908 (2005).

Yu, N., et al. "High-quality epitaxial growth of gamma-alumina films on α-alumina sapphire induced by ion-beam bombardment." Physical Review-Series B-52 (1995): 17-518.

Cai et al., "Phase transformation mechanism between γ- and ϴ-alumna," *Physical Review B* 67, 224104 (2003).

Cai et al., "Atomic Scale Mechanism of the Transformation of γ-Alumnia and ϴ-alumna," *Physical Review Lettrs*, vol. 89, No. 23, Dec. 2, 2002, 4 pages.

Clarke, D. R. "Epitaxial phase transformations in aluminum oxide." physica status solidi (a) 166.1 (1998): 183-196.

O'Dell, Luke A., et al. "A 27Al MAS NMR study of a sol-gel produced alumina: Identification of the NMR parameters of the ϴ-$Al_2O_3$ transition alumina phase." Solid state nuclear magnetic resonance 31.4 (2007): 169-173.

Krokidis, Xénophon, et al. "Theoretical study of the dehydration process of boehmite to γ-alumina." The Journal of Physical Chemistry B 105.22 (2001): 5121-5130.

Yu, Ning, et al. "Doping effects on the kinetics of solid-phase epitaxial growth of amorphous alumina thin films on sapphire." Applied physics letters 67.7 (1995): 924-926.

Maret, Hannah, et al. "Seeded solid-phase epitaxy of atomic layer deposited aluminum oxide." Crystal Growth & Design 16.3 (2016): 1662-1666.

Zhou, R-S., and Robert L. Snyder. "Structures and transformation mechanisms of the η, γ and ϴ transition aluminas." Acta Crystallographica Section B: Structural Science 47.5 (1991): 617-630.

\* cited by examiner

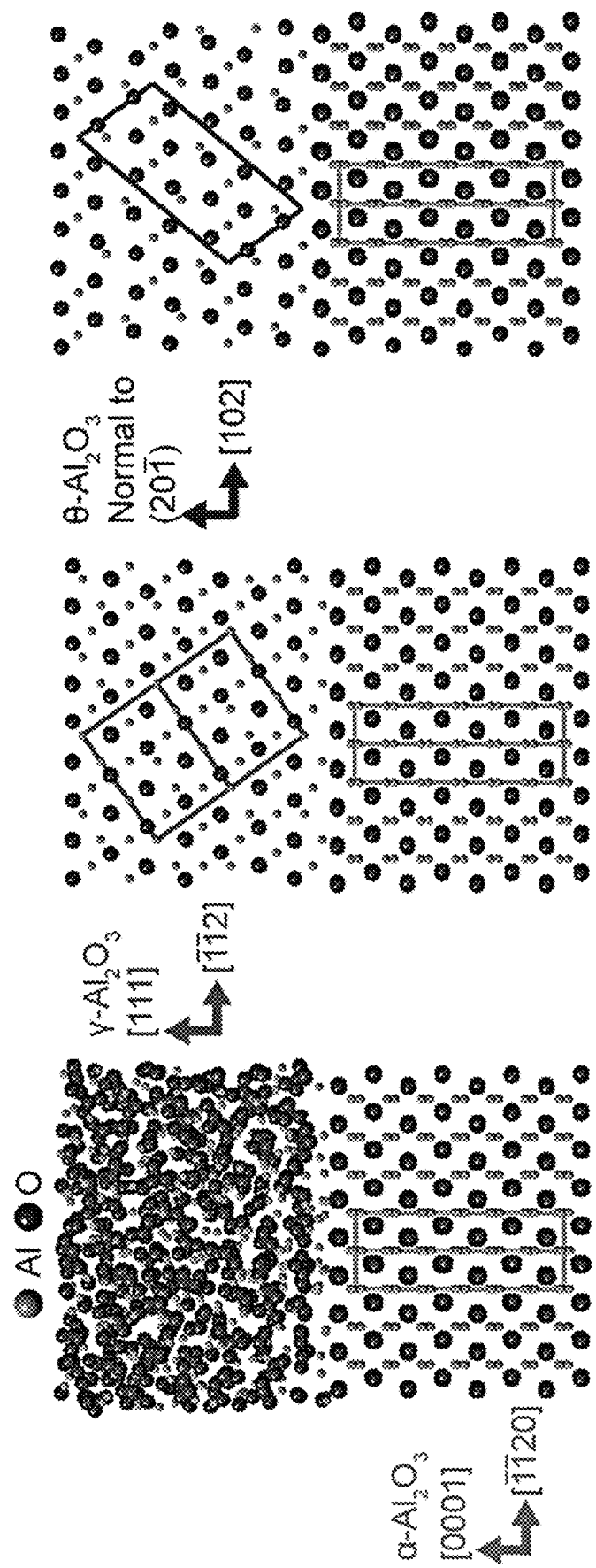

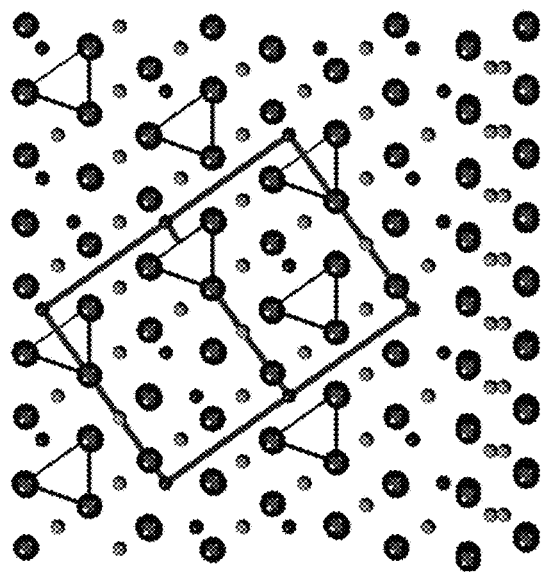
FIG. 8A
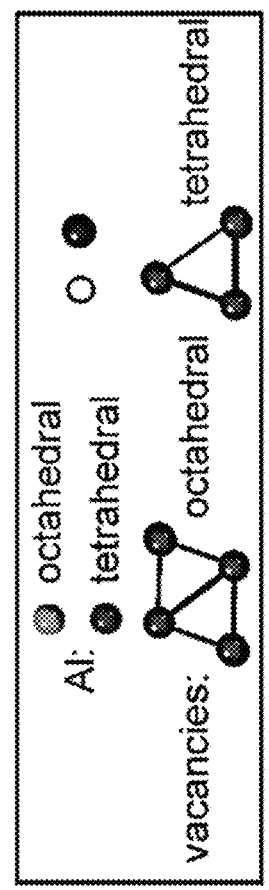
FIG. 8B
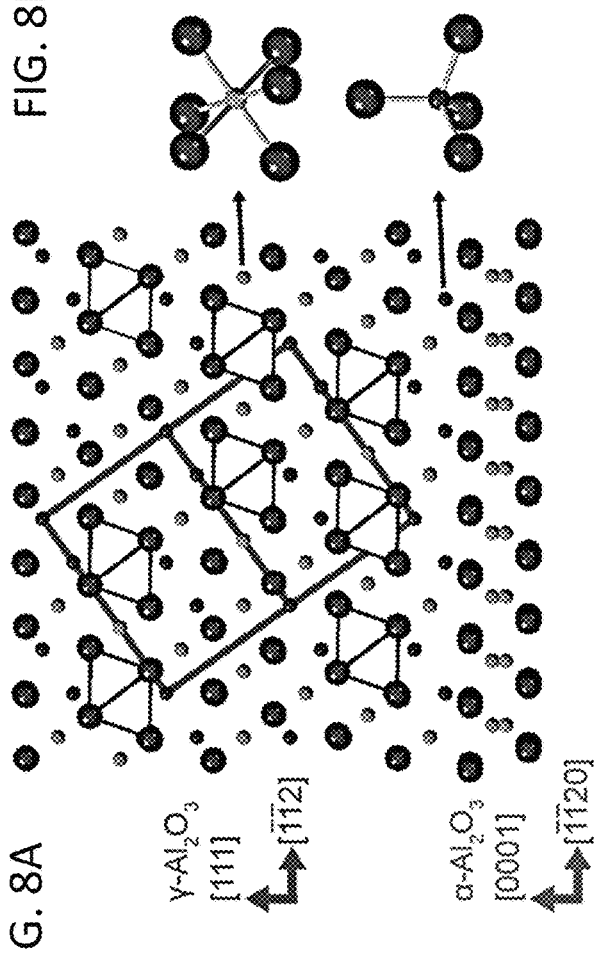
FIG. 8C
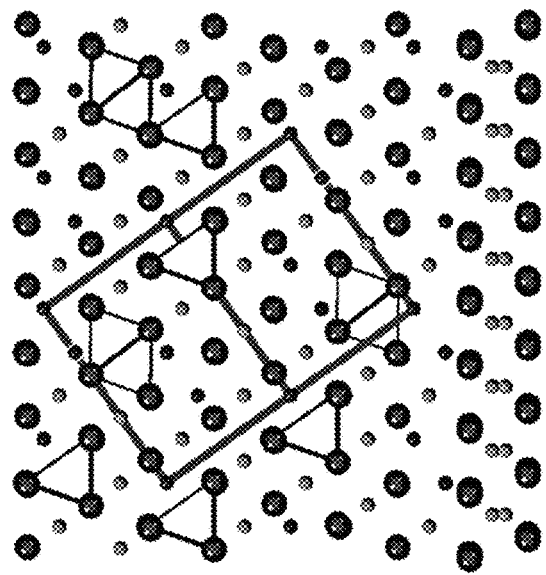

LOW-DEFECT-DENSITY GAMMA PHASE ALUMINUM OXIDE SUBSTRATES FOR HETEROEPITAXIAL SYNTHESIS

REFERENCE TO GOVERNMENT RIGHTS

This invention was made with government support under 1720415 awarded by the National Science Foundation. The government has certain rights in the invention.

BACKGROUND

Polymorphism is a widespread phenomenon in metal oxides due to the similarity of valence, bonding configuration, and density among phases with different structures but identical compositions. The phenomenon occurs in a wide range of materials and can arise in part from the complexity that accompanies the creation of compounds involving several metal ion species. Even comparatively chemically simple oxides consisting of a single metal ion, however, can have several metastable crystal structures with corresponding differences in density, symmetry, and ionic coordination. These polymorphs can exhibit significant differences in properties relevant to their direct use in optical, electronic, magnetic, and catalytic applications and their indirect application as substrates for epitaxial growth of other compounds. The existence of multiple polymorphs leads to a range of kinetic phenomena in crystallization, especially in nanoscale systems in which the structure is influenced by the proximity of surfaces and interfaces, and by complex elastic stress distributions.

The synthesis of phase-pure metastable oxides, especially in the form of thin films, has been challenging because in the best cases the polymorphs exhibit only small differences in free energy with respect to the stable phase or other competing metastable phases. Conditions that favor the thermodynamically stable phase, such as high temperatures and long annealing times, can make the metastable polymorphs highly unfavorable and thus can make their formation even more challenging. Synthesis methods designed to yield metastable polymorphs of a selected compound thus often yield materials in which multiple polymorphs are present. The practical implications of this synthesis challenge are that it is particularly difficult to produce metastable polymorphs with the degree of control required to employ their promising properties in applications and to conduct and to interpret experiments to determine their structure and properties.

Aluminum oxide, $Al_2O_3$, exhibits multiple polymorphs and has widespread applications in electronic materials, catalysis, and surface passivation. The polymorphs of $Al_2O_3$ include the thermodynamically stable phase at ambient pressure, $\alpha$-$Al_2O_3$, as well as several structural phases that are metastable at ambient pressure.

The initial crystallization of amorphous $Al_2O_3$ often occurs through the formation of $\gamma$-$Al_2O_3$. It has been shown that planar thin films of amorphous $Al_2O_3$ on $Al_2O_3$ crystallize into $\gamma$-$Al_2O_3$ upon heating and subsequently convert to the $\alpha$-$Al_2O_3$ at high temperature. solid-phase epitaxy (SPE) of $Al_2O_3$ on sapphire substrates has previously been studied using amorphous $Al_2O_3$ created by methods including electron-beam evaporation, ion implantation, and atomic layer deposition (ALD). SPE leads to the formation of $\gamma$-$Al_2O_3$ from the amorphous layers, which occurs with a rate matching the duration of practical experiments at high temperatures; e.g., 800° C. (Simpson, T. W. et al., *J. Am. Ceram. Soc.* 1998, 81, 61-66; Jang, J. et al., *ACS Appl. Mater. Interfaces* 2018, 10, 41487-41496; McCallum, J. C. et al., *Nucl. Instr. and Meth. in Phys. B* 1994, 91, 60-62.) The $\gamma$-$Al_2O_3$ then transforms to the stable $\alpha$-phase at higher temperature, often above 800° C. (Simpson et al., 1998; Jang et al., 2018; McCallum et al., 1994.)

Crystallized $Al_2O_3$ thin films produced from amorphous layers typically have x-ray rocking curve angular widths that are far larger than single crystals, indicating that there is a comparatively high concentration of defects. (Levin, I. et al., *J. Am. Ceram. Soc.* 1998, 81, 1995-2012; and Yu, N. et al., *Phys. Rev. B* 1995, 52, 17518-17522.) The high defect density reduces the usefulness of materials exhibiting multiple phases, for example in applications as substrates for subsequent epitaxial growth.

SUMMARY $Al_2O_3$ thin films having a high $\gamma$-phase purity and low defect density and methods for making the aluminum oxide thin films are provided. Also provided are heterostructures that incorporate the $Al_2O_3$ thin films.

One embodiment of an $Al_2O_3$ film comprises at least 70 mol. % $\gamma$-$Al_2O_3$, the $Al_2O_3$ film having an x-ray rocking curve for an $Al_2O_3$ 222 reflection with a full width at half maximum of 0.06° or lower, a film thickness of less than 200 nm, and a lateral cross-sectional area of at least 1 $cm^2$.

Once embodiment of a heterostructure includes: an $Al_2O_3$ film comprising at least 70 mol. % $\gamma$-$Al_2O_3$, the $Al_2O_3$ film having an x-ray rocking curve for an $Al_2O_3$ 222 reflection with a full width at half maximum of 0.06° or lower, a film thickness of less than 200 nm, and a lateral cross-sectional area of at least 1 $cm^2$; and an epitaxial overlayer on the $Al_2O_3$ film, the epitaxial overlayer comprising an inorganic thin film.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIG. 1A shows amorphous $Al_2O_3$ on $\alpha$-$Al_2O_3$. FIG. 1B shows epitaxial $\gamma$-$Al_2O_3$ on $\alpha$-$Al_2O_3$. FIG. 1C shows epitaxial $\theta$-$Al_2O_3$ on $\alpha$-$Al_2O_3$. The unit cells of each polymorph appear as solid lines.

FIGS. 8A-8C show representative structures of γ-Al$_2$O$_3$ in which (FIG. 8A) all Al vacancies occupy octahedral sites, (FIG. 8B) all Al vacancies occupy tetrahedral sites, and (FIG. 8C) the occupation has the same statistics as the site occupation matching the experimentally observed lattice parameter. The inset shows the local configuration of octahedral and tetrahedral Al sites.

DETAILED DESCRIPTION

Figure 1D:
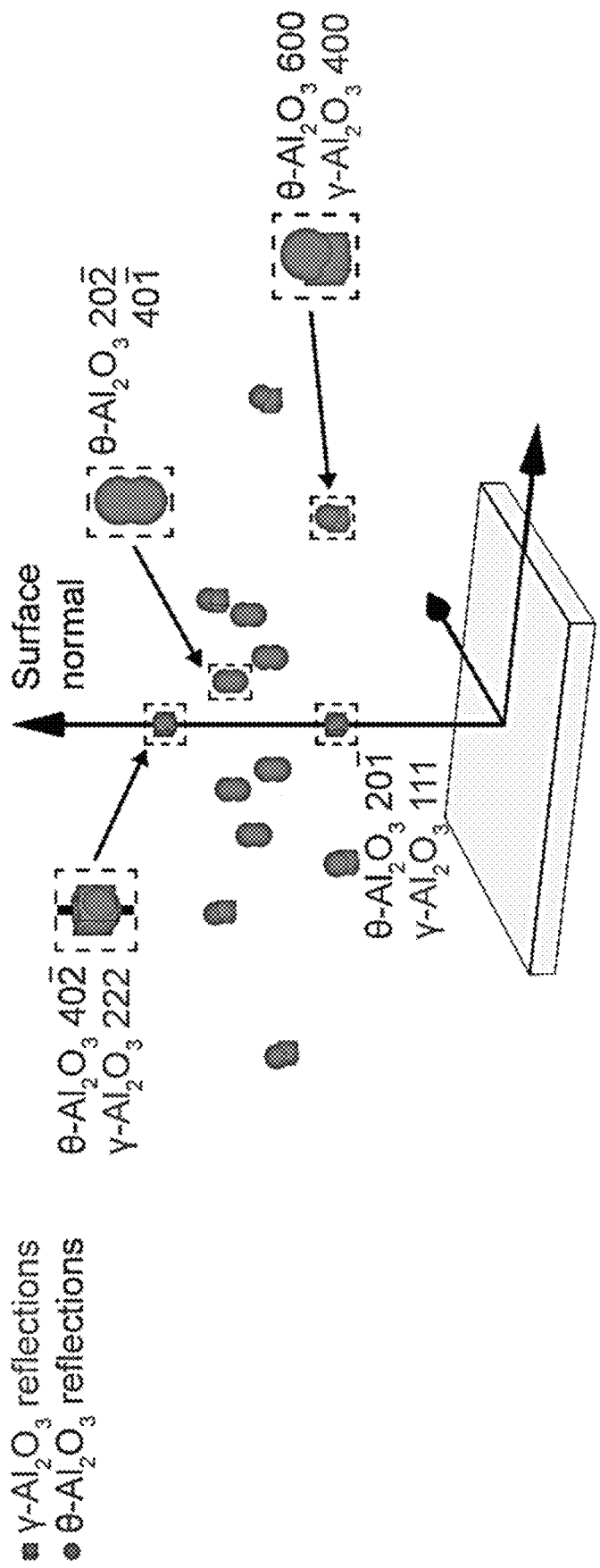
FIG. 1D shows reciprocal-space locations of x-ray reflections from $\gamma$-$Al_2O_3$ and $\theta$-$Al_2O_3$ used in the experiments described in the Example.

Al$_2$O$_3$ thin films having a high γ-phase purity and low defect density and methods for making the aluminum oxide thin films are provided. Also provided are epitaxial heterostructures that incorporate the aluminum oxide films as growth substrates and methods of forming the epitaxial heterostructures.

The Al$_2$O$_3$ films are pure, or nearly pure, γ-Al$_2$O$_3$ and have a low density of defects. As such, the films contain no, or only a very low concentration of, other Al$_2$O$_3$ polymorph phases. In particular, the Al$_2$O$_3$ films contain no, or only a very low concentration of, the γ-Al$_2$O$_3$ polymorph phase, which is naturally present as a competing phase in Al$_2$O$_3$ films that are crystallized using previously reported methods. Various embodiments of the highly γ-Al$_2$O$_3$ phase pure, low defect density films comprise at least 70 mol. % γ-Al$_2$O$_3$. This includes embodiments of the highly γ-Al$_2$O$_3$ phase pure, low defect density films comprising at least 90 mol. % γ-Al$_2$O$_3$, and at least 98 mol. % γ-Al$_2$O$_3$. For example, the films can have γ-Al$_2$O$_3$ phase fractions in the range from 90 mol. % to 100 mol. % γ-Al$_2$O$_3$ and from 95 mol. % to 98 mol. % γ-Al$_2$O$_3$.

The ability to form the high γ-phase purity and low defect density Al$_2$O$_3$ films is based, at least in part, on the inventors' discovery that amorphous Al$_2$O$_3$ films on a α-Al$_2$O$_3$ sapphire substrate initially transform, upon heating, into epitaxial γ-Al$_2$O$_3$, followed by a transformation to an intermediate monoclinic γ-Al$_2$O$_3$ phase, and eventually to α-Al$_2$O$_3$. The discovery that an intermediate γ-Al$_2$O$_3$ phase forms during the transformation from γ-Al$_2$O$_3$ to α-Al$_2$O$_3$ and a detailed study of the kinetics of the epitaxy and transitions between the metastable phases of Al$_2$O$_3$ during the transformation enabled the identification of SPE conditions that result in the crystallization of the γ-Al$_2$O$_3$ phase with a drastically reduced density of structural defects from amorphous Al$_2$O$_3$, while avoiding the microstructural inhomogeneity arising from the spatially inhomogeneous transformation to γ-Al$_2$O$_3$.

Past studies have overlooked the presence of the γ-Al$_2$O$_3$ phase during the multi-step transformation, likely because it is very difficult to distinguish the x-ray reflections from the different phases using measurements of the diffracted intensity along the surface normal, i.e., conventional thin-film x-ray θ/2θ scans. Similarly, there are several other strong reflections at which the γ-Al$_2$O$_3$ and γ-Al$_2$O$_3$ are indistinguishable. As a result, the γ-Al$_2$O$_3$ phase has not been reported in studies of the crystallization of amorphous Al$_2$O$_3$ on α-Al$_2$O$_3$ and, as a result, no steps have been taken in the reported studies to avoid the formation of the γ-Al$_2$O$_3$ phase.

The γ-phase purity and low defect density of the Al$_2$O$_3$ films described herein are reflected in the narrow width, as measured by the full width at half maximum (FWHM) of the x-ray rocking curve for the Al$_2$O$_3$ 222 reflection. By way of illustration, various embodiments of the Al$_2$O$_3$ films have x-ray rocking curves for the Al$_2$O$_3$ 222 reflection with FWHMs of 0.06° or lower. These include Al$_2$O$_3$ films having x-ray rocking curves for the Al$_2$O$_3$ 222 reflection with FWHMs of 0.05° or lower, 0.04° or lower, and 0.03° or lower. For example, Al$_2$O$_3$ films having x-ray rocking curves for the Al$_2$O$_3$ 222 reflection with FWHMs in the range from 0.01° to 0.06°, in the range from 0.02° to 0.05°, and in the range from 0.03° to 0.05° can be formed using the methods described herein. (Methods for measuring the FWHM of an x-ray rocking curve for a Al$_2$O$_3$ 222 reflection are described in the Example.) In contrast, the FWHM of the rocking curves for γ-Al$_2$O$_3$ films reported in the literature are ten to twenty times larger—indicating the presence of substantial concentrations of additional polymorphs, such as θ-Al$_2$O$_3$.

Films of highly γ-Al$_2$O$_3$ phase pure aluminum oxide with low defect densities, as reflected by low mosaic widths in their x-ray rocking curves, can be formed by a kinetic route using SPE. SPE is the crystallization from an amorphous form with an orientation or phase selected using a seed crystal. The crystallization and phase transformation in SPE occur through the atomic reconfiguration at interfaces.

SPE can be carried out on an amorphous Al$_2$O$_3$ film, which initially transforms upon heating to form epitaxial γ-Al$_2$O$_3$. The transformation is then arrested to prevent or minimize the growth of the metastable monoclinic θ-Al$_2$O$_3$ phase and, eventually, the α-Al$_2$O$_3$ phase. The starting amorphous Al$_2$O$_3$ film may itself be deposited on a (0001) α-Al$_2$O$_3$ sapphire substrate. However, α-Al$_2$O$_3$ substrates with other surface orientations, such as ($1\bar{2}10$) and ($01\bar{1}2$), can also be used. The orientations of the γ-Al$_2$O$_3$ and epitaxial films grown on it can be extended to (001) due to the surface symmetries of other α-Al$_2$O$_3$ substrates.

Illustrative steps in an SPE protocol that can be used to form the low defect density, highly γ-Al$_2$O$_3$ phase pure films desirably begins with pre-treatment to remove contaminants from the α-Al$_2$O$_3$ substrate. Such pretreatments generally include a washing step and a thermal treatment. By way of illustration only, the α-Al$_2$O$_3$ substrate may be sonicated in deionized (DI) water, then heated to a temperature above 1200° C. (e.g., ~1400 C) for a period of 6 hours or more. A layer of amorphous $Al_2O_3$ is then formed on the $\alpha$-$Al_2O_3$ substrate. The amorphous layer can be formed using, for example, atomic layer deposition (ALD). Once formed, the amorphous $Al_2O_3$ layer is heated to a temperature and for a time sufficient to induce the transformation of the amorphous $Al_2O_3$ into a film of $\gamma$-$Al_2O_3$ that is free of, or contains only very low concentrations of other $Al_2O_3$ polymorphs, such as $\theta$-$Al_2O_3$. Suitable crystallization temperatures and times are discussed below and illustrated in the Example. The SPE crystallization can be carried out under an atmosphere that does not affect the crystallization process, such as in $O_2$ gas or air and may be, but is not necessarily, conducted at atmospheric pressure.

The $\gamma$-$Al_2O_3$ films grown via SPE on $\alpha$-$Al_2O_3$ sapphire can include a single domain, or two domains related by a 180° rotation around [111]. The presence of two domains is consistent with the two possible ways that the face-centered cubic (FCC) stacking sequence of the oxygen layers can be continued from the $\alpha$-$Al_2O_3$ substrate into the $\gamma$-$Al_2O_3$ layer. However, a single-domain $\gamma$-$Al_2O_3$ film can be grown by using a substrate in which a surface miscut orientation and magnitude, on the order of degrees, promote the formation of a single domain.

An important factor in preventing the formation of the $\theta$-$Al_2O_3$ phase during SPE is the crystallization temperature, with lower temperatures favoring a highly phase pure $\gamma$-$Al_2O_3$ film. Generally, temperatures of 700° C. or lower promote the transformation to $\gamma$-$Al_2O_3$ without the growth of the $\theta$-$Al_2O_3$ phase. Temperatures of less than 700° C. may be used. However, the rate of crystallization will decrease with decreasing temperatures. By way of illustration only, crystallization temperatures in the range from 680° C. to 700° C. may be used. However, higher temperatures can be used for thinner films.

Other conditions that should be carefully controlled to avoid the growth of the $\theta$-$Al_2O_3$ polymorph are the SPE crystallization time and the film thickness. If the crystallization is allowed to proceed too long, the $\theta$-$Al_2O_3$ phase will begin to form. Therefore, SPE crystallization times of 60 minutes or shorter are suitable. For example, SPE crystallization times in the range from 10 minutes to 30 minutes can be used. Low film thicknesses are advantageous because thin films allow the amorphous $Al_2O_3$ film to crystallize into $\gamma$-$Al_2O_3$ throughout the entire thickness of the film before the onset of $\theta$-$Al_2O_3$ phase growth. In addition, thinner films may have a different stress state and may include fewer structural defects arising from processes that relax the epitaxial mismatch. The reduced defect concentration can result in fewer defects on which the $\theta$-$Al_2O_3$ phase can nucleate. For this reason, the low defect density, highly $\gamma$-$Al_2O_3$ phase pure films and the amorphous $Al_2O_3$ films from which they are formed desirably have film thicknesses of 200 nm or less, including thicknesses of 100 nm or less, 50 nm or less, or 10 nm or less. By way of illustration, various embodiments of the low defect density, highly $\gamma$-$Al_2O_3$ phase pure films have thicknesses in the range from 0.8 nm to 200 nm, including the range from 0.8 nm to 100 nm, and further including the range from 0.8 nm to 50 nm and from 0.8 nm to 10 nm. $\gamma$-$Al_2O_3$ films with thicknesses in these ranges having a $\gamma$-$Al_2O_3$ phase purity of at least 70 mol. %, at least 90 mol. %, and at least 98 mol. % can be formed.

These illustrative temperature, time, and film thickness parameters are interrelated and, therefore, can be adjusted together to produce a low defect density, highly $\gamma$-$Al_2O_3$ phase pure film. For example, at lower crystallization temperatures, longer crystallization times and/or thicker films can be produced. Alternatively, low defect density, highly $\gamma$-$Al_2O_3$ phase pure films with very small film thicknesses can be produced using higher crystallization temperatures and/or longer crystallization times. Thus, for very thin films, temperatures greater than about 700° C. can be used, including temperatures in the range from 700° C. to 800° C. At the higher end of this temperature range (for example, from 750° C. to 800° C.) highly $\gamma$-$Al_2O_3$ phase pure, low defect density films having thicknesses of less that 20 nm, including thicknesses of less than 10 nm can be formed. Such films include those having a $\gamma$-$Al_2O_3$ phase content of greater than 95 mol. %, greater than 99 mol. % and 100 mol. %.

Large-area films of the highly phase-pure $\gamma$-$Al_2O_3$ can be formed. This makes the films suitable for use as growth substrates for the epitaxial growth of large-area inorganic oxide thin films of compounds having cubic or hexagonal crystal structures. By way of illustration, highly phase-pure $\gamma$-$Al_2O_3$ films having a lateral cross-sectional area of at least 1 cm 2, at least 2 $cm^2$, at least 10 $cm^2$, or at least 100 $cm^2$ can be produced, where the lateral cross-section refers to a plane orthogonal to the film thickness direction. Perovskite oxides and/or other materials that have been grown on $SrTiO_3$ substrates are examples of materials that can be grown epitaxially on the low defect density, highly phase-pure $\gamma$-$Al_2O_3$ films. The replacement of $SrTiO_3$ with $\gamma$-$Al_2O_3$ as a growth substrate is advantageous because $\gamma$-$Al_2O_3$ has much lower dielectric loss at high frequencies compared with $SrTiO_3$. The epitaxial growth of one or more overlayers may be carried out using known methods, such as chemical vapor deposition or molecular beam epitaxy.

Some potential application areas of the highly $\gamma$-$Al_2O_3$ phase pure, low defect density films, including the (111)-oriented films, are as epitaxial growth substrates for $Pb[Zr_xTi_{1-x}]O_3$ (lead zirconate; commonly referenced as PZT), which has valuable applications in ultrasound and integrated optics applications; and $BiFeO_3$ (bismuth ferrite; commonly referenced as BFO), which has been developed as a potential lead-free piezoelectric material. Notably, $\alpha$-$Al_2O_3$ substrates are well-suited for the growth of BFO films because the thermal expansion coefficient of sapphire is close to that of BFO. However, it is difficult to realize the epitaxial growth of BFO films directly on $\alpha$-$Al_2O_3$ because of the different structure symmetry and the large lattice mismatch. The highly phase pure $\gamma$-$Al_2O_3$ films described herein can promote the crystallization and orientation control of the BFO thin films due to the similarity in crystal structures. Other inorganic compounds that can be grown on the highly $\gamma$-$Al_2O_3$ phase pure, low defect density films include $KTaO_3$ (potassium tantalate; commonly referenced as KTO). KTO is a quantum paraelectric material, which is on the verge of the ferroelectric transition in which ferroelectricity is compressed by quantum fluctuations at low temperatures. Superconductivity has been discovered at the interface between (111)-oriented KTO and $LaAlO_3$ or EuO. Thus, the high $\gamma$-$Al_2O_3$ phase purity, low defect density films with an (111) orientation described herein can be used to synthesize (111)-oriented KTO-based heterostructures with superconducting interfaces. $SrVO_3$ (strontium vanadate; commonly referenced as SVO) can also be grown epitaxially on the highly $\gamma$-$Al_2O_3$ phase pure, low defect density films. SVO is a transparent conducting oxide that can be used to form electrodes for photovoltaic cells and displays and to create smart windows. Transparent conducting SVO thin films with a cubic crystal structure can be synthesized on the highly $\gamma$-$Al_2O_3$ phase pure, low defect density films. In addition, SVO is water-soluble and SVO buffer layers can be used to synthesize large-area freestanding thin films on the highly γ-$Al_2O_3$ phase pure, low defect density films by depositing SVO thin films thereon before the deposition of other thin films. The SVO buffer layer then can be dissolved in water and the released top layer will be a free-standing thin film with a large area. Garnets are another example of materials that can be grown epitaxially on the highly γ-$Al_2O_3$ phase pure, low defect density films. Garnets have the general chemical formula $X_3Z_2(TO_4)_3$, where X, Y, and T are metals or metalloids. The lattice parameters of garnets are commonly approximately 12 Å and can be epitaxially grown on a 7.88 Å lattice parameter of γ-$Al_2O_3$ through an arrangement in which two garnet unit cells span the same distance as three γ-$Al_2O_3$ unit cells. Garnets have applications in magnetooptical devices and as emerging spintronic and spin caloritronic devices requiring large area thin films.

EXAMPLE

The experiments and simulations reported here include detailed structural characterization and MD simulations of the initial stages of the crystallization of amorphous $Al_2O_3$ and the kinetic regimes in which γ-$Al_2O_3$ and γ-$Al_2O_3$ are favored. The results reveal that γ-$Al_2O_3$ can be formed with minimal formation of the competing polymorphs. The initially amorphous $Al_2O_3$ film on (0001) α-$Al_2O_3$ substrate is shown schematically in FIG. 1A. The structures of the crystallized γ-$Al_2O_3$ and the θ-$Al_2O_3$ layers formed by the transformation from γ-$Al_2O_3$ are shown in FIGS. 1B and 1C, respectively. The epitaxial relationships depicted in FIGS. 1A-1D are consistent with the experimental results, and the structural principles guiding the proposed interface configuration are described below.

The interpretation of the x-ray diffraction results was guided by considering the reciprocal-space locations of the x-ray reflections of γ-$Al_2O_3$ and θ-$Al_2O_3$. FIG. 1D illustrates the reciprocal-space locations of several γ-$Al_2O_3$ and θ-$Al_2O_3$ x-ray reflections considered in this example. The diagram in FIG. 1D includes reflections for two variants of γ-$Al_2O_3$ and six structural variants of θ-$Al_2O_3$, with reciprocal-space locations in the experimental observations below. The γ-$Al_2O_3$ and θ-$Al_2O_3$ x-ray reflections along the surface-normal direction of reciprocal space were not widely separated. The $20\bar{1}$ reflection of θ-$Al_2O_3$ and the 111 reflection of γ-$Al_2O_3$, for example, had interplanar spacings that differed by only 0.05 Å. The small differences made it difficult to distinguish these reflections using measurements of the diffracted intensity along the surface normal, i.e., conventional thin-film x-ray θ/2θ scans. Similarly, there were several other strong reflections at which the γ-$Al_2O_3$ and θ-$Al_2O_3$ were indistinguishable. These reflections have been studied in previous reports, and as a result, the θ-$Al_2O_3$ phase has not been reported in studies of the crystallization of amorphous $Al_2O_3$ on α-$Al_2O_3$. (Simpson et al., 1998; Jang et al., Clarke, D. R., Phys Status Solidi A 1998, 166, 183-196.2018; Yu, N. et al., Appl. Phys. Lett. 1995, 67, 924-926; McCallum et al., 1994; Sklad, P. S. et al., Nucl Instrum Meth B 1990, 46, 102-106; White, C. W. et al., Nucl. Instr. and Meth. in Phys. Res. B 1988, 32, 11-22.) The experiments described herein employed two sets of reflections in which γ-$Al_2O_3$ and θ-$Al_2O_3$ can be separately probed, as illustrated in FIG. 1D. Reflections in the γ-$Al_2O_3$ 400 family and θ-$Al_2O_3$ 600 family were close together but can be distinguished within the resolution of thin-film x-ray diffraction experiments and the angular width of the reflections of practical samples.

Crystallized $Al_2O_3$ thin films produced from amorphous layers typically have x-ray rocking curve angular widths that are far larger than single crystals, indicating that there is a comparatively high concentration of defects. (Levin, I. et al., J. Am. Ceram. Soc. 1998, 81, 1995-2012; Simpson et al., 1998; Yu, N. et al., Phys. Rev. B 1995, 52, 17518-17522; McCallum et al., 1994; White et al., 1988.) The high defect density reduces the usefulness of materials exhibiting multiple phases, for example in applications as substrates for subsequent epitaxial growth. In addition, high-resolution thin-film x-ray diffraction measurements of the lattice parameters and microstructural features are impractical in poorly ordered structures. The results here indicate that the phase transformation between polymorphs and the resulting structural inhomogeneity contributed significantly to this mosaic broadening. The full width at half maximum (FWHM) of the rocking curves of γ-$Al_2O_3$ 222 x-ray reflection under these conditions was 0.03°, indicating low-mosaicity in the film. FWHM value was much smaller than the best value reported in previous studies without such control, 1.4°. (Yu et al., 1995.) The discovery of this phase sequence in epitaxial thin films allowed low-defect-density γ-$Al_2O_3$ to be formed under conditions with a low concentration of γ-$Al_2O_3$. The large single-crystalline γ-$Al_2O_3$ can be used as substrates for materials with cubic or hexagonal structures, which can broaden the choices of substrates for oxides and enable large area processing on low-defect-density commercial substrates.

Methods

Deposition and Heating

Amorphous $Al_2O_3$ films with thicknesses of 100 nm were deposited on (0001) α-$Al_2O_3$ substrates by atomic layer deposition (ALD). The substrates were prepared by sonication in DI water for 40 min and heating to 1400° C. in air for 10 h. These processes yielded a stepped surface morphology with uniform terrace width, as observed using atomic force microscopy. The substrate was cooled to 1000° C., removed from the furnace, and immediately loaded into the ALD reactor under flowing high-purity $N_2$ gas. Amorphous thin films deposited on substrates when there was a significant delay between the introduction to the ALD reactor resulted in poorly ordered crystalline after heating, suggesting that the interfacial contamination between the substrates and the thin films should be controlled in order to obtain high quality thin films. The ALD reactor was held at 200° C. during the deposition. The ALD process used a series of gas pulses: (i) trimethyl aluminum (in $N_2$ carrier gas) for 5 s at 0.7 Torr, (ii) $N_2$ purge for 20 s at 0.5 Torr, (iii) $H_2O$ (in $N_2$ carrier gas) for 18 s at 1.5 Torr, and (iv) $N_2$ purge for 30 s at 0.5 Torr. The deposition rate for $Al_2O_3$ was 1.1 Å/cycle. The amorphous films reported here were obtained with layers deposited using a total of 850 cycles.

The amorphous $Al_2O_3$ thin films were crystallized and transformed between polymorphs by heating in $O_2$ gas at atmospheric pressure for 1 h at temperatures from 700° C. to 1020° C. After heating, the samples were removed from the furnace and cooled in room-temperature air at atmospheric pressure.

The scaling of the SPE crystallization process to lower $Al_2O_3$ layer thicknesses was then demonstrated through the crystallization of an amorphous layer with an initial thickness of 9.7 nm. A (0001) oriented α-$Al_2O_3$ substrate was prepared by chemical cleaning and heating in an oxidizing environment. An amorphous $Al_2O_3$ layer was deposited using the atomic layer deposition from trimethyl aluminum and water precursors. The thickness of the amorphous layer was measured using x-ray reflectivity, giving a thickness value of 9.7 nm. The $Al_2O_3$ layer was fully crystallized by heating to 800° C. for 1 hour. The thickness measured after the heating step using x-ray reflectivity was 8.1 nm. The change in the thickness indicated that the $Al_2O_3$ layer was crystallized during this heating process. Atomic force microscopy images of the surface of the $Al_2O_3$ layer after heating indicated that it remained sufficiently smooth for epitaxial growth after crystallization.

Characterization

A high-resolution diffractometer (Empyrean, Panalytical Inc.) was used for both x-ray reflectivity and high-resolution x-ray diffraction. The incident beam optics employed either a multilayer mirror that yields high-intensity Cu Kα radiation or a combination of the multilayer mirror and a channel-cut crystal that yields monochromatic Cu Kai radiation. A second diffractometer (D8 ADVANCE, Bruker, Inc.) employed a Cu Kα point-focus beam and an area x-ray detector was used to determine the polymorph composition and orientation. The measurements were taken at room temperatures (i.e., ~ 23° C.).

Molecular Dynamics (MD) Simulation Methods

Classical MD simulation probed the epitaxial crystallization of amorphous $Al_2O_3$. The interatomic potential employed in these simulations had previously been calibrated using the experimental lattice parameters of α-$Al_2O_3$ and the nearest neighbor Al—O distance. (Matsui, M., *Mineralog. Mag.* 1994, 58, 571-572.) The amorphous structure produced using this potential also agreed with x-ray and neutron diffraction observations. (Gutiérrez, G. et al., *Phys. Rev. B* 2002, 65, 104202.) The interatomic potentials take the Coulomb-Buckingham form in which the short-range electrostatics, the exponential repulsion, and van del Waals attraction terms are cut off at 8.0 Å. The particle-mesh Ewald method was used to compute the long-range electrostatic interaction.

The MD simulation was conducted using the GROMACS 2018 program. (Berendsen, H. J. et al., *Comp. Phys. Commun.* 1995, 91, 43-56.) The temperature was set using a stochastic-term-based velocity-rescaling thermostat with a 0.1 ps relaxation time. Amorphous $Al_2O_3$ at selected temperatures and densities was generated using the following procedure. An α-$Al_2O_3$ crystal containing 4320 atoms (864 formula units) was first equilibrated at 1600 K at 1 atm using the Berendsen barostat in the isothermal-isobaric ensemble. All simulations after the initial equilibration of α-$Al_2O_3$ were conducted in the canonical ensemble. After the equilibration, the system was heated to 5000 K and then quenched to 3000 K at a rate of 20 K/ps, which removed the dependence of the final amorphous structure on the starting polymorph. The density of the amorphous $Al_2O_3$ system was changed to 3.0 g/cm$^3$, approximately matching the experimentally observed density, by rescaling atomic positions and the size of the simulation box along the direction that was subsequently used as the surface normal during simulations of epitaxial crystallization. The simulation box dimensions along the other two directions were not adjusted in order to allow the amorphous structure to be joined to the substrate in a subsequent step. The final amorphous $Al_2O_3$ was obtained by quenching the system from 3000 K to 1600 K at 2 K/ps and equilibrating for 200 ps after quenching.

The amorphous-crystalline interface was created by appending the amorphous structure to the (0001) surface of an equilibrated α-$Al_2O_3$ supercell containing 2160 atoms serving as the substrate for epitaxial crystallization. A vacuum layer with a thickness of 30 Å was added on top of the amorphous structure. A two-step relaxation was employed before the production run to remove artifacts in the simulated amorphous/α-$Al_2O_3$ interface structure. An initial relaxation step was performed in which the α-$Al_2O_3$ substrate was subjected to a strong position constraint so that only the amorphous layer relaxed. In a second step, all atoms except the ones within 8 Å of the amorphous-crystalline interface were subject to the same position constraint so that atoms near the interface were fully relaxed. Both relaxations employed durations of 200 ps at 1600 K.

The production run had a simulated duration of 20 ns. A layer of α-$Al_2O_3$ with a thickness of 5 Å at the bottom of the simulation box, farthest from the interface, was frozen in order to mimic a semi-infinite substrate. The results below are analyzed using a coordinate system in which the z-axis is along the [0001] direction of the crystalline α-$Al_2O_3$ substrate.

The results of the MD simulation were studied using a statistical analysis of the coordination of the Al and O atoms. The Steinhardt order parameter $\bar{q}_{l,\beta-\beta}(i)$ was used to distinguish between different polymorphs of $Al_2O_3$. (Lechner, W. et al., *J. Chem. Phys.* 2008, 129, 114707.) The quantity $\bar{q}_{l,\beta-\beta}(i)$ was computed by first defining a quantity $q_{lm,\beta-\beta}(i)$ to measure the coordination symmetry up to the first coordination shell:

$$q_{lm,\beta-\beta}(i) = \frac{1}{N_\beta(i)} \sum_{j=1}^{N_\beta(i)} Y_{lm}(r_{ij}) \qquad (1)$$

Here the index i enumerates all atoms of type β, $N_\beta(i)$ is the number of nearest neighbors of type β around the atom with index i, and l and m are integer parameters where m runs from −l to l. The functions $Y_{lm}(r_{ij})$ are spherical harmonics and $r_{ij}$ is the unit vector from atom i to atom j. A second quantity, $\bar{q}_{lm,\beta-\beta}(i)$, provides information on the coordination symmetry up to the second coordination shell by averaging of $q_{lm,\beta-\beta}(i)$ over its neighbors of type β:

$$\bar{q}_{lm,\beta-\beta}(i) = \frac{1}{1+N_\beta(i)} \left[ q_{lm,\beta-\beta}(i) + \sum_{j=1}^{N_\beta(i)} q_{lm,\beta-\beta}(j) \right] \qquad (2)$$

Here the sum includes atom i and its neighbors of type β. Taking the average of $q_{lm,\beta-\beta}(i)$ provides a clearer distinction between different crystal structures at the price of losing coordination information around single atoms. The Steinhardt bond order parameter $\bar{q}_{l,\beta-\beta}(i)$ for atom i is obtained by summing over m, yielding a rotationally invariant result ranging from 0 to 1 that is useful in recognizing the crystal structure regardless of the spatial orientation:

$$\bar{q}_{l,\beta-\beta}(i) = \sqrt{\frac{4\pi}{2l+1} \sum_{m=-l}^{l} \left| \bar{q}_{lm,\beta-\beta}(i) \right|^2} \qquad (3)$$

The Steinhardt order parameter is sensitive to different coordination symmetries depending on the choice of l. (Steinhardt, P. J. et al., *Phys. Rev. B* 1983, 28, 784-805.) The oxygen sublattice in the polymorphs of $Al_2O_3$ discussed in this example is either hexagonal close packed, as for α-$Al_2O_3$, or FCC, as in γ-$Al_2O_3$ and γ-$Al_2O_3$. Both symmetries can be probed by the l=6 spherical harmonics. Hence $\bar{q}_{6,O-O}$ and $\bar{q}_{6,Al-Al}$ were used in this example to identify different polymorphs of $Al_2O_3$.

The coordination number distribution of 0 atoms around Al atoms can be determined by computing the fraction of various Al-O polyhedra in which Al is coordinated with χ=3, 4, 5, or 6 O ions. The x=4 and x=6 cases corresponded to tetrahedral and octahedral coordination, respectively. An O atom was considered as coordinated to the central Al atom if their separation is within a hard cutoff $r_c$=2.5 Å, which is the first minimum of the partial radial distribution function between Al atoms and O atoms. In this example, coordination number distribution of O atoms around Al atoms for simulated amorphous $Al_2O_3$ and epitaxial γ-$Al_2O_3$ were computed to determine the distribution of Al atoms over tetrahedral and octahedral spinel sites.

Results and Discussion

Polymorph Identification and Phase Fractions of γ-$Al_2O_3$ and θ-$Al_2O_3$

The crystallization of amorphous $Al_2O_3$ resulted in the development of a sequence of crystalline phases. The mass density, as evaluated using x-ray reflectivity, provided a guideline for the overall progress of the crystallization. The density of the as-deposited amorphous $Al_2O_3$ layers determined from the critical angle for total external x-ray reflection was 3.1±0.1 g/cm³. This amorphous layer density matched the value reported in the literature. (Groner, M. et al., Chem. Mater. 2004, 16, 639-645.) The crystallization of $Al_2O_3$ resulted in a decrease of the film thickness and an increase in density, both of which were apparent in x-ray reflectivity measurements. $Al_2O_3$ layers heated to a comparatively low temperature of 750° C. were not crystallized after 1 h and exhibited a decrease in thickness of only 3%, corresponding to a small increase with respect to the as-deposited density. Heating to between 800° C. and 1020° C. for 1 h resulted in a decrease in the thickness by 16% to a density of 3.5±0.1 g/cm³, consistent with the crystallization of the $Al_2O_3$ layer. The densities of γ-$Al_2O_3$ (3.61 g/cm³) and γ-$Al_2O_3$ (3.60 g/cm³) could not be distinguished within the precision of the x-ray reflectivity measurement.

The dependence of phase composition of the $Al_2O_3$ layer on heating temperature was studied using a series of x-ray diffraction measurements. The x-ray characterization employed a region of reciprocal space in which reflections in the γ-$Al_2O_3$ 600 family and the γ-$Al_2O_3$ 400 family appeared and can be clearly distinguished, as illustrated in FIG. 2A. The intensities $I_{γ400}$ and $I_{θ600}$ for the γ-$Al_2O_3$ 400 and γ-$Al_2O_3$ 600 families, respectively, were both obtained by integrating and averaging the intensities of the six orientations of each reflection. The intensities obtained in this way are shown in FIG. 2B for layers heated to a series of different temperatures.

Figure 2B:
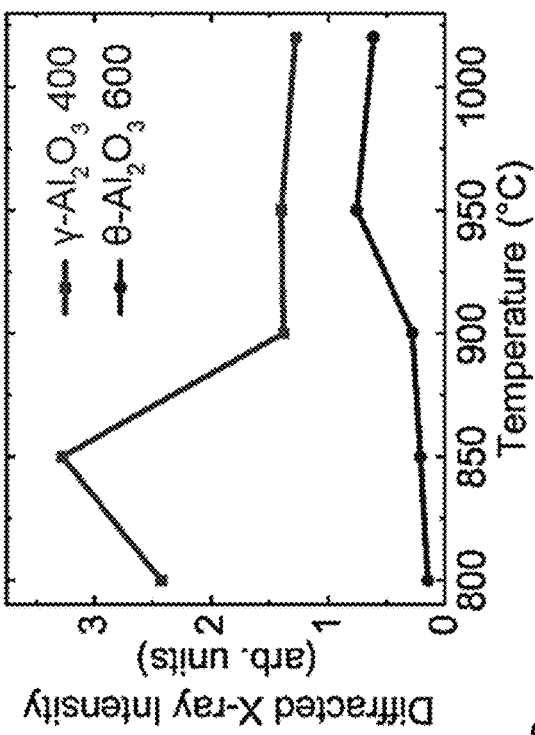
FIG. 2B shows integrated intensities of $\theta$-$Al_2O_3$ 600 and $\gamma$-$Al_2O_3$ 400 reflections obtained after heating to different temperatures.

A quantitative analysis of the intensities in FIG. 2B allows the volume fractions of the γ-$Al_2O_3$ and γ-$Al_2O_3$ phases to be determined. With volumes $V_γ$ and $V_θ$ for the two phases, the volume fractions $f_γ$ and $f_θ$ are $$f_γ = \frac{V_γ}{V_θ + V_γ} = \frac{I_{γ400}}{I_{tot,corr}}$$

and $$f_θ = \frac{V_γ}{V_θ + V_γ} = \frac{cI_{θ600}}{I_{tot,corr}},$$

with $I_{tot,corr} = I_{γ400} + cI_{θ600}$. Here $$c = \frac{|F|^2_{γ400}}{|F|^2_{θ600}} \frac{LP_{γ400}}{LP_{θ400}} \frac{N_{θ600}}{N_{γ400}} = 7.69,$$

where F, with appropriate subscripts, is the structure factor for each set of reflections. LP is Lorentz-polarization factor for the two phases. Nis the number of variants that contribute to the integrated intensity: 2 for the γ-$Al_2O_3$ 400 reflections and 6 for γ-$Al_2O_3$ 600 reflections. The volume fractions of γ-$Al_2O_3$ and γ-$Al_2O_3$ are shown as a function of temperature in FIG. 2C.

The intensities of reflections for both phases were zero, within experimental uncertainty, following heating to 750° C. Two other temperature regimes are apparent in FIGS. 2B and 2C. After heating to 800 and 850° C., the majority of the crystallized layer was in the γ-$Al_2O_3$ phase, with $f_θ$=30%. Higher temperatures during the heating process, from 900° C. to 1020° C., resulted in higher values of $f_θ$, approximately 80% after heating to 1020° C. Scanning transmission electron microscopy measurements were conducted for films heated to 1020° C. and the results indicated that both γ-$Al_2O_3$ and γ-$Al_2O_3$ appeared in the first few tens of nm from the interface and were approximately randomly distributed in the layer crystallized under these conditions.

A further experiment was conducted to determine whether γ-$Al_2O_3$ formed directly from amorphous $Al_2O_3$ or resulted from a transformation from γ-$Al_2O_3$. An initially amorphous $Al_2O_3$ layer was heated at 800° C. for 1 h to form γ-$Al_2O_3$ and then heated again to 1020° C. for a further 1 h. The fraction of γ-$Al_2O_3$ following this two-step process was 80%, which is the same as the fraction observed in the film directly heated to 1020° C. for 1 hour. It was thus concluded that the γ-$Al_2O_3$ resulted from a transformation from the γ-$Al_2O_3$ rather than a direct crystallization from the amorphous layer into θ-$Al_2O_3$.

Figure 3B:
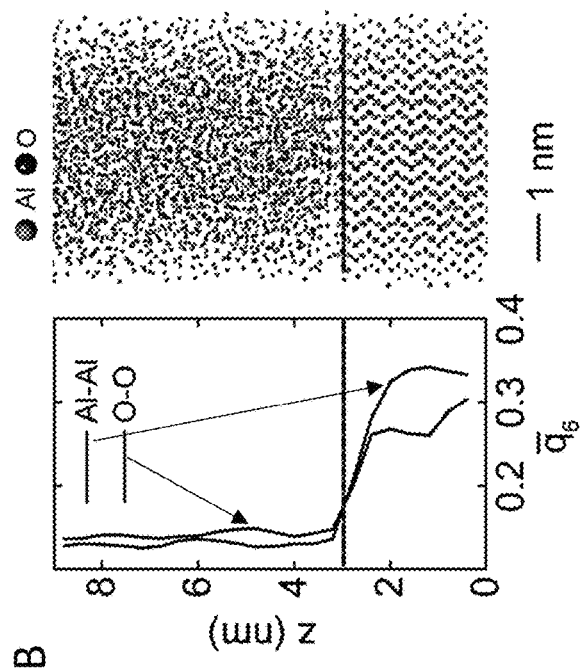
FIG. 3A shows marginal and joint distribution of $\bar{q}_{6,Al-Al}$ and $\bar{q}_{6,O-O}$ from molecular dynamics (MD) simulations of amorphous $Al_2O_3$, termed A in the legend, and the $\alpha$-$Al_2O_3$, $\gamma$-$Al_2O_3$, and $\theta$-$Al_2O_3$ polymorphs at 1600 K and 1 atm. Atomic positions and the position dependence of $\bar{q}_{6,Al-Al}$ and $\bar{q}_{6,O-O}$ for (FIG. 3B) the amorphous $Al_2O_3$ on $\alpha$-$Al_2O_3$ starting configuration and (FIG. 3C) the γ-Al$_2$O$_3$ on α-Al$_2$O$_3$ configuration reached after crystallization.
Figure 3C:
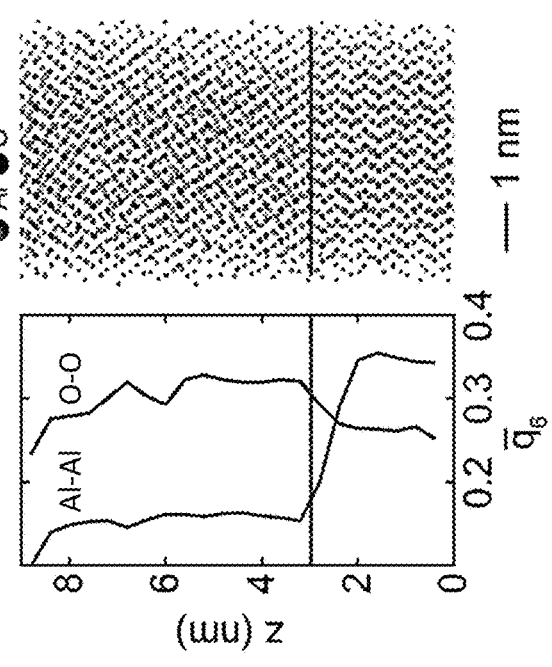
Figure 3A:
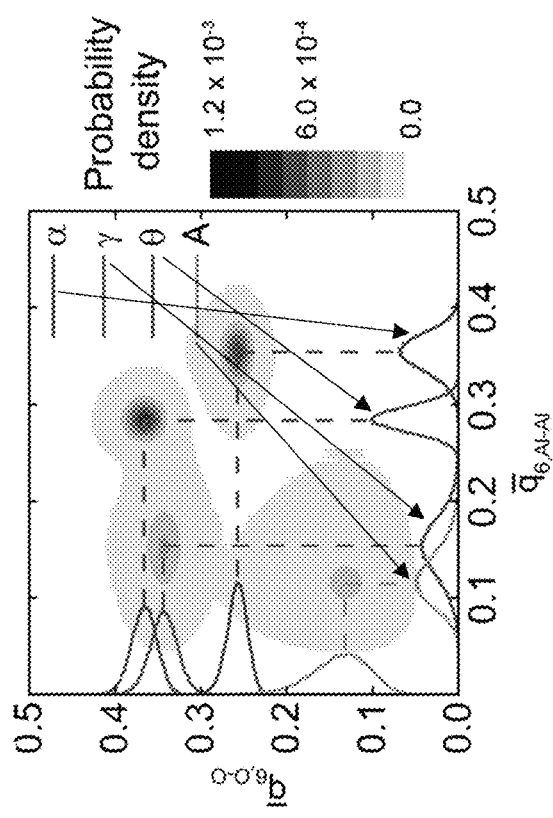

The Steinhardt order parameter $\bar{q}_{6,Al-Al}$ and $\bar{q}_{6,O-O}$ was used to identify the polymorphs of $Al_2O_3$ formed during crystallization in MD simulations. Reference values of these parameters were obtained from simulations of the bulk phases at 1600 K and 1 atm. The probability distribution of $\bar{q}_{6,Al-Al}$ and $\hat{q}_{6,O-O}$ and their joint distribution for four different $Al_2O_3$ structures reached after different stages in the MD simulation are shown in FIG. 3A. The marginal distributions were normalized on the unit interval [0,1] and the joint distributions were normalized on the unit region [0,1]×[0,1]. γ-$Al_2O_3$ and O—$Al_2O_3$ had nearly identical $\bar{q}_{6,O-O}$ distributions with a peak value of 0.32, because the O sublattices in both γ-$Al_2O_3$ and γ-$Al_2O_3$ exhibited FCC packing. The most common Al—O coordinations were those in which Al is coordinated with 4 O ions (47%) and 5 O ions (47%). A small proportion, approximately 10%, of the ions were in three-fold and six-fold coordinations. In the epitaxial γ-$Al_2O_3$ layers produced by the MD simulation, the most frequent Al coordinations were tetrahedral coordination (29%) and octahedral coordination (70%). Amorphous $Al_2O_3$ and γ-$Al_2O_3$ also had similar distributions of values of $\bar{q}_{6,Al-Al}$ with maxima at 0.12 and 0.15, respectively. The amorphous and γ-$Al_2O_3$ structures had Al ion arrangements that were more similar to each other as compared to other polymorphs.

The values of the Steinhardt order parameter shown in FIG. 3A can be used to interpret the results of the MD simulation. A snapshot of atomic positions and the variation of $\bar{q}_{6,O-O}$ and $\bar{q}_{6,Al-Al}$ as a function of position in MD simulation before crystallization is shown in FIG. 3B. The α-$Al_2O_3$ phase shown for the calibration of the Steinhardt order parameter in FIG. 3A had a peak value of $\bar{q}_{6,O-O}$ of 0.26 and $\bar{q}_{6,Al-Al}$ of 0.35. The position dependence of $\bar{q}_6(z)$ in FIGS. 3A-3C was obtained by averaging of all atoms within from z to z+4 Å. The crystalline region in the simulation (α-$Al_2O_3$) had values of these parameters of 0.27 and 0.35, as appropriate for the initial conditions of the simulation. The values of $\bar{q}_{6,O-O}$ and $\bar{q}_{6,Al-Al}$ for the amorphous region of FIG. 3B were also consistent with the initial expectations.

The phase formed upon crystallization can be determined from the Steinhardt order parameters obtained for the crystallized layers and visual inspection. FIG. 3C shows a snapshot of the simulation and the spatial variation of $\bar{q}_{6,O-O}$ and $\bar{q}_{6,Al-Al}$ after the completion of the crystallization simulation. The expected values of $\bar{q}_{6,O-O}$ and $\bar{q}_{6,Al-Al}$ for the γ-Al$_2$O$_3$ phase were 0.32 and 0.15, respectively. The crystallized layer in FIG. 3C had values $\bar{q}_{6,O-O}$ and $\bar{q}_{6,Al-Al}$ of 0.31 and 0.15, matching γ-Al$_2$O$_3$ closely. These values, however, do not match the γ-Al$_2$O$_3$ or α-Al$_2$O$_3$ polymorphs, indicating that the MD simulation resulted in the epitaxial crystallization of γ-Al$_2$O$_3$, consistent with the experiment.

The results shown in FIGS. 3A-3C suggest a mechanism for the crystallization of amorphous Al$_2$O$_3$. The transformation from amorphous to γ-Al$_2$O$_3$ can structurally occur by crystallization of the O sublattice into FCC packing with minimal change in the Al atom arrangement from five-fold coordination to six-fold coordination. In this picture, γ-Al$_2$O$_3$ forms first out of amorphous Al$_2$O$_3$ since the γ-Al$_2$O$_3$ polymorphs is structurally more similar to the amorphous structure than γ-Al$_2$O$_3$ in terms of Al atom arrangement, which can be seen while comparing the $\bar{q}_{6,Al-Al}$ values in FIG. 3A.

Figure 4A:
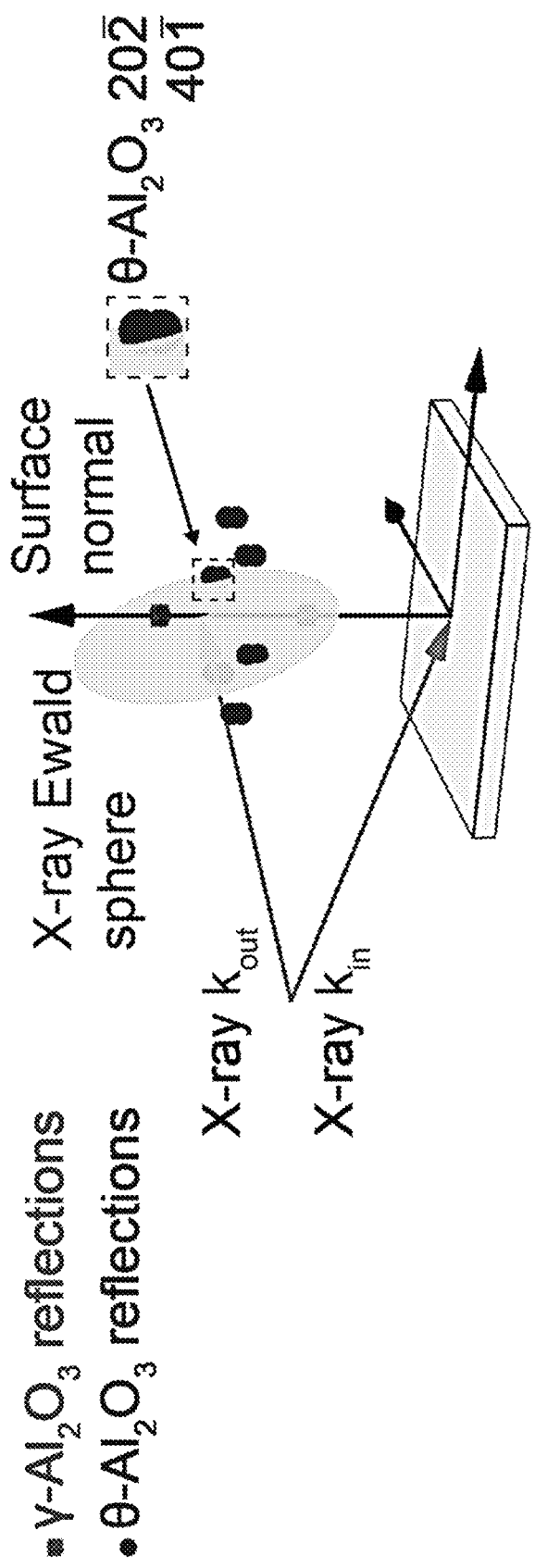
FIG. 4A shows the scattering geometry for x-ray experiments probing the $20\bar{2}$ and $40\bar{1}$ reflections of θ-Al$_2$O$_3$, as discussed in the Example. Diffraction patterns exhibiting $20\bar{2}$ and $40\bar{1}$ reflections of θ-Al$_2$O$_3$ after heating to (FIG. 4B) 800° C.
Figure 4B:
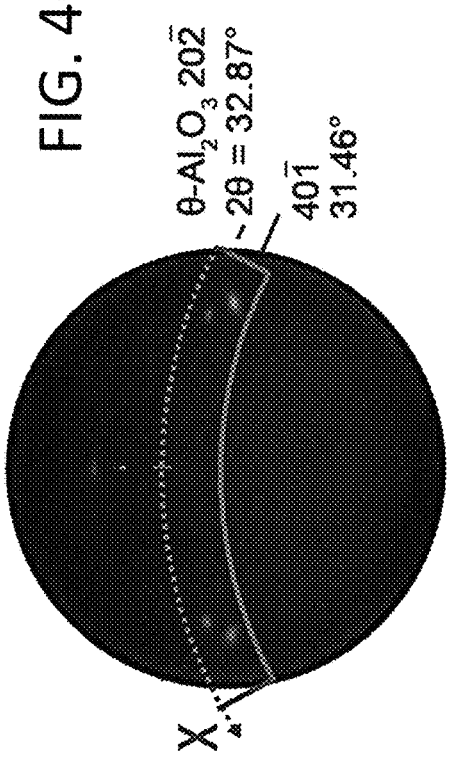
(FIG. 4C) 1020° C.
FIG. 4D shows intensities as a function of χ obtained by integrating across the indicated regions of FIG. 4B and FIG. 4C. Notations A and B indicate which of two variants of θ-Al$_2$O$_3$ contributes to each reflection, such that $40\bar{1}$A and $20\bar{2}$A arise from variant A. The sharp features near χ=0 arise from scattering along the surface-normal reciprocal space truncation rod.
Figure 4C:
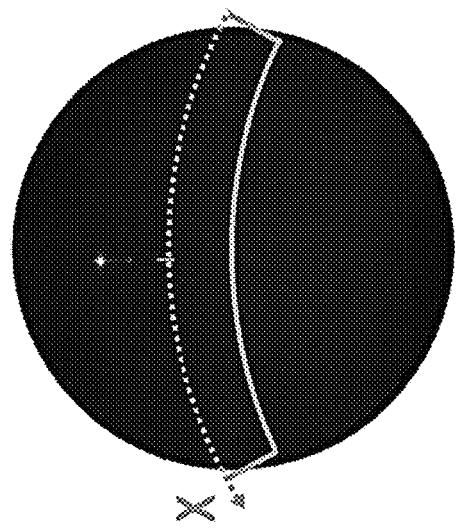

The formation of the γ-Al$_2$O$_3$ in the experiments was studied using a series of x-ray diffraction studies. The crystallographic parameters of the γ-Al$_2$O$_3$ phase were probed using the γ-Al$_2$O$_3$ 202 and 401 families of x-ray reflections, which arise in a region of reciprocal space in which there are no γ-Al$_2$O$_3$ reflections. A diagram of the reciprocal space of the γ-Al$_2$O$_3$ layers formed in these experiments and the x-ray scattering geometry are shown in FIG. 4A. The x-ray diffraction patterns acquired as average during a rotation through the Bragg conditions for these reflections after heating to 800° C. and 1020° C. are shown in FIGS. 4B and 4C, respectively. The diffraction patterns were obtained by rotating the sample over a 5° range of incident angles with respect to the sample surface. The layer crystallized at 800° C. exhibited only weak reflections of γ-Al$_2$O$_3$, which indicates that a small fraction of the film was in the γ-Al$_2$O$_3$ phase. Two intense pairs of 202 and 401 reflections from two variants of γ-Al$_2$O$_3$ were apparent in the film heated at 1020° C., as shown in FIG. 4C.

Figure 4D:
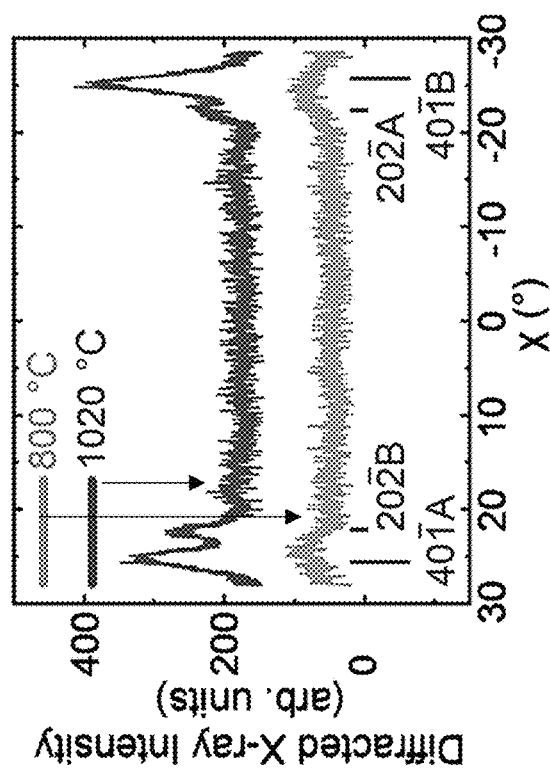

The angular separation of the reflections in FIG. 4C was measured using the diffraction angle χ, which is the azimuthal angle between the reflections along the diffraction cone of constant 2θ intercepting the Ewald sphere. The intensities integrated across the regions indicated in the diffraction patterns are shown as a function of χ in FIG. 4D. The angular separation of the 202 and 401 reflections for the layer heated to 1020° C. was 45.7°. The interplanar spacings derived from the values of 2θ and the χ separation in FIG. 4D were a=11.9 Å, c=5.62 Å and β=103.3°. The lattice parameter b=2.86 Å was derived by combining these measurements with the measured 2θ angle of the 712 reflection. The lattice parameters and χ separation were consistent with the reported structure of γ-Al$_2$O$_3$. (Guse, W. et al., N. Jahrbuch Mineral. Monat. 1990, 217-226.) Twelve-fold azimuthal symmetry was observed in the 7$\bar{1}$2 reflections, which also indicated the phase reached by the transformation from γ-Al$_2$O$_3$ was γ-Al$_2$O$_3$.

Figure 2C:
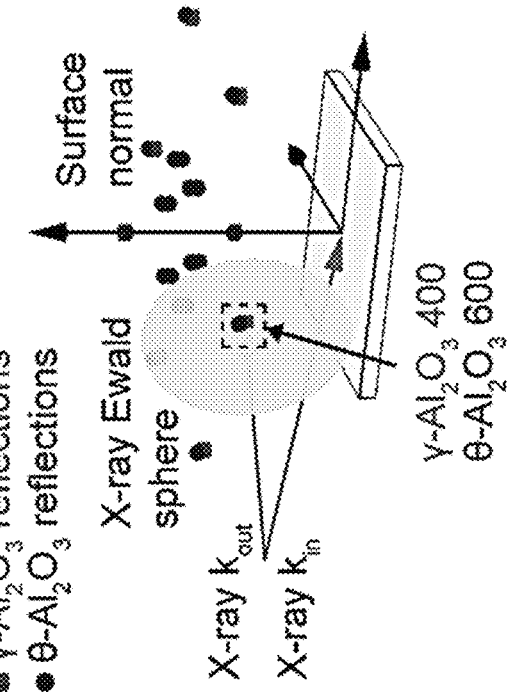
FIG. 2C shows fractions of $\gamma$-$Al_2O_3$ and $\theta$-$Al_2O_3$ as a function of heating temperature.
Figure 2A:
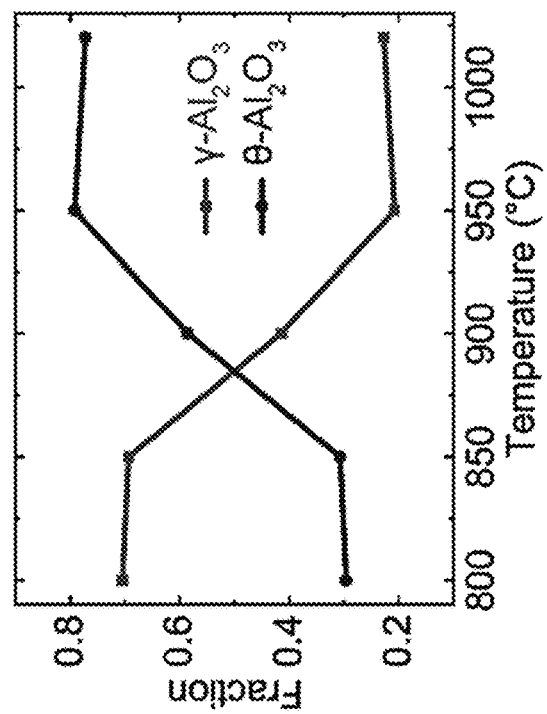
FIG. 2A shows the scattering geometry for x-ray experiments probing $\gamma$-$Al_2O_3$ 400 and $\theta$-$Al_2O_3$ 600 reflections, as described in the Example. The vectors X-ray $k_{in}$ and X-ray $k_{out}$ denote the directions and magnitudes of the wavevectors of the incident x-ray beam and the beam diffracted to the center of the detector, respectively.

The structural parameters of the γ-Al$_2$O$_3$ phase were measured using two sets of x-ray reflections that provided (i) the interplanar spacing along the surface-normal direction of reciprocal space and (ii) the distortion in the plane parallel to the surface. FIG. 5A shows θ/2θ scans of the films that had been heated to 800° C. and 1020° C. for 1 hour. The thin-film reflections in FIG. 5A were indexed with the γ-Al$_2$O$_3$ and γ-Al$_2$O$_3$ reflections along this line in reciprocal space, which had nearly identical interplanar spacings. As indicated in FIGS. 2A-2C, films heated to 800° C., however, were composed mostly of γ-Al$_2$O$_3$ and the reflections and the intensity peaks at that temperature can be indexed as the γ-Al$_2$O$_3$ 111, 222, 333, and, 444 reflections. The (111) interplanar spacing of γ-Al$_2$O$_3$ determined from the γ-Al$_2$O$_3$ reflections in FIG. 5A was 4.53 Å.

Figure 5B:
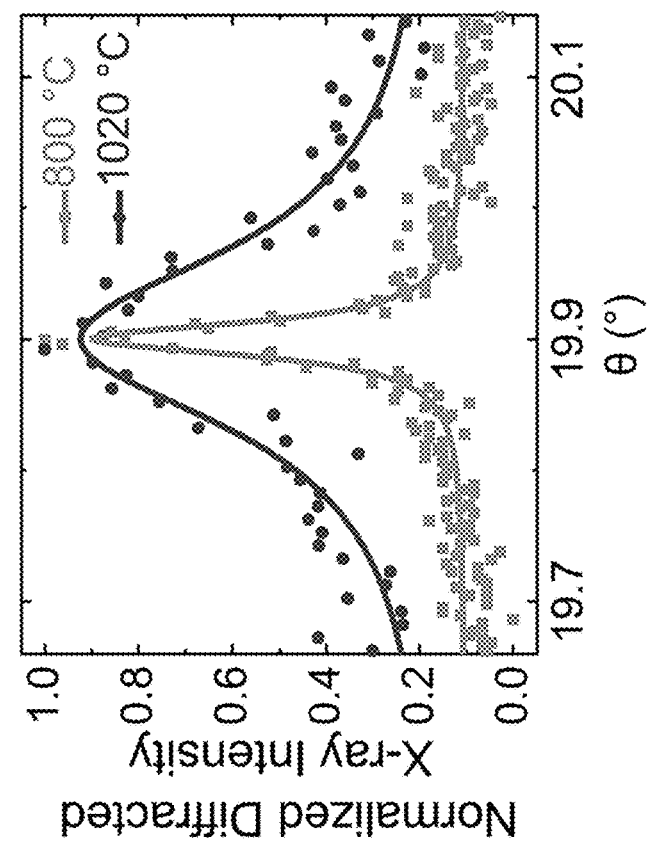
FIG. 5B shows rocking curves of the γ-Al$_2$O$_3$ 222 reflection for films heated to 800° C. and 1020° C. for 1 h.
Figure 5A:
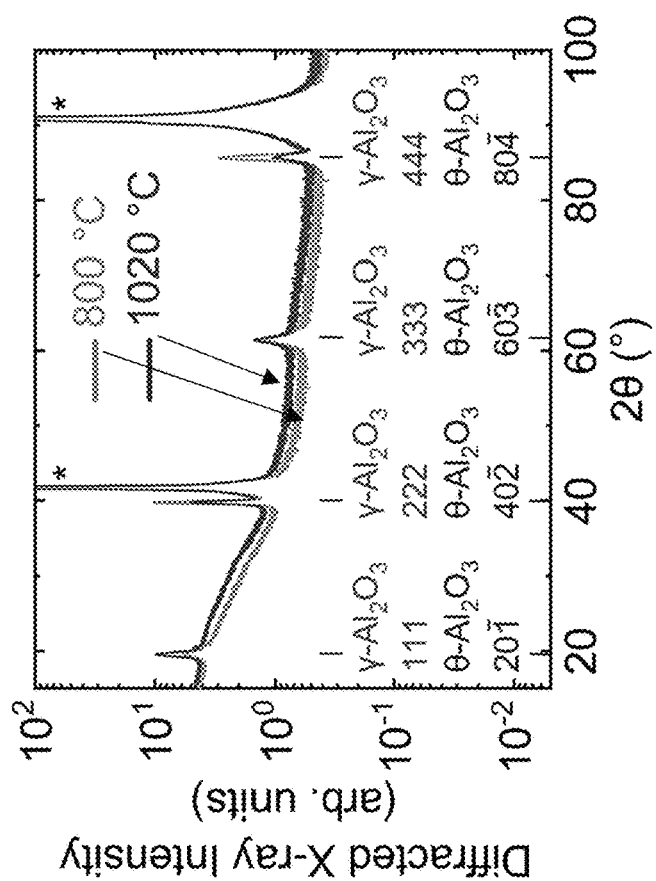
FIG. 5A shows a θ/2θ x-ray diffraction scan along the surface normal direction of reciprocal space after heating to 800° C. or 1020° C. for 1 hour.

An x-ray rocking curve for the γ-Al$_2$O$_3$ 222 reflection of a sample heated to 800° C. is shown in FIG. 5B, along with a rocking curve for a layer of a mixture of the γ-Al$_2$O$_3$ and θ-Al$_2$O$_3$ phases after heating to 1020° C. The FWHM of the rocking curve of γ-Al$_2$O$_3$ was 0.030 after heating at 800° C. It was hypothesized that the larger FWHM of the sample heated at 1020° C. arose from the microstructural inhomogeneity associated with the partial transformation from γ-Al$_2$O$_3$ to θ-Al$_2$O$_3$.

Figure 6A:
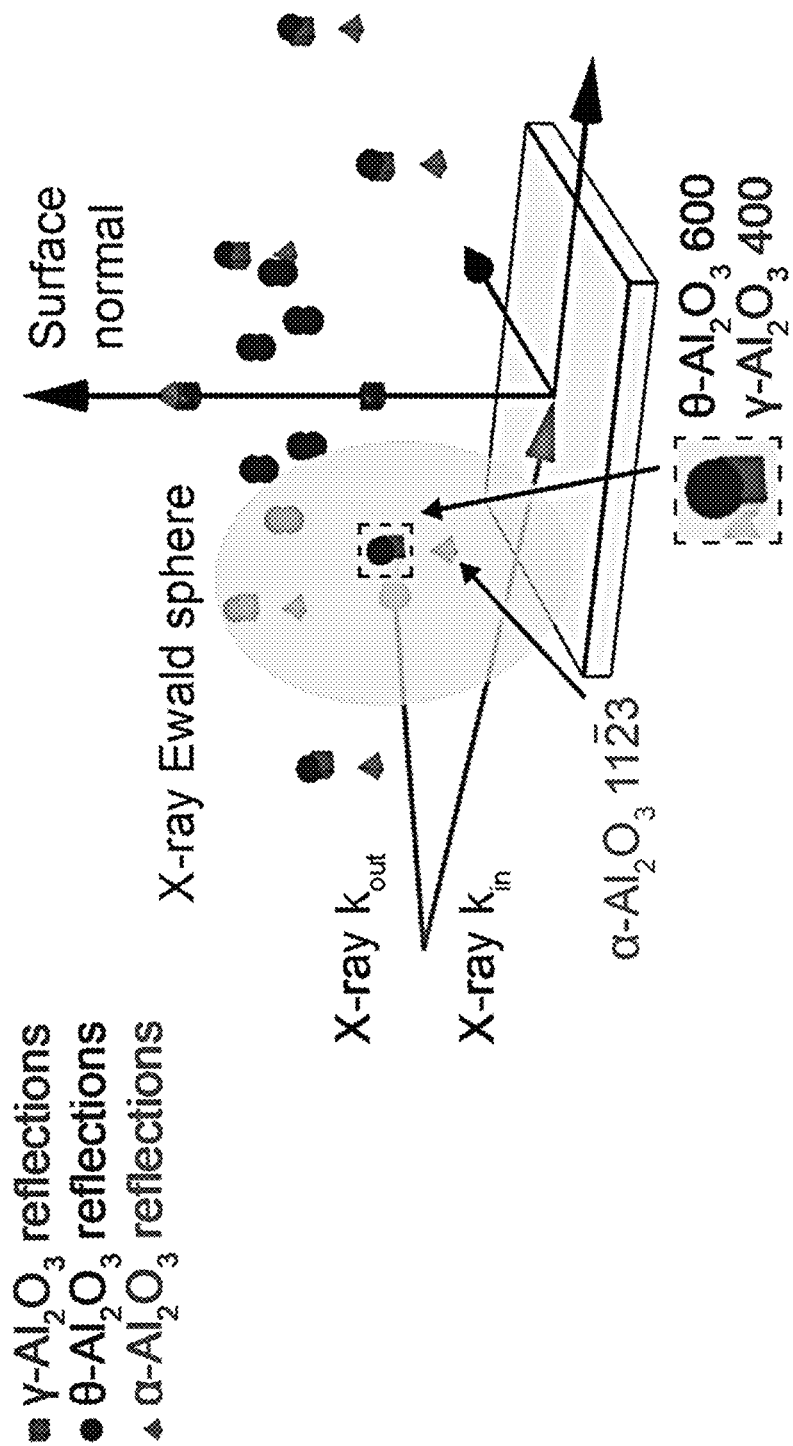
FIG. 6A shows scattering geometry for x-ray experiments probing γ-Al$_2$O$_3$ 400 and θ-Al$_2$O$_3$ 600 reflections.
Figure 6B:
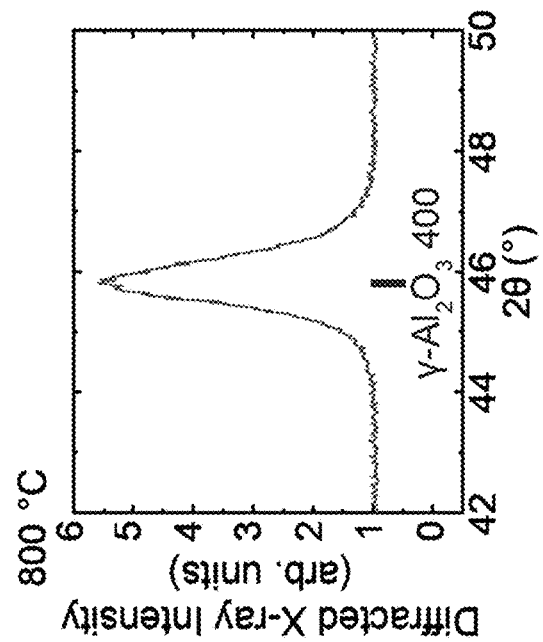
FIG. 6B shows an X-ray diffraction pattern recorded using the geometry indicated in FIG. 6A during a rocking scan after heating to 800° C.
Figure 6C:
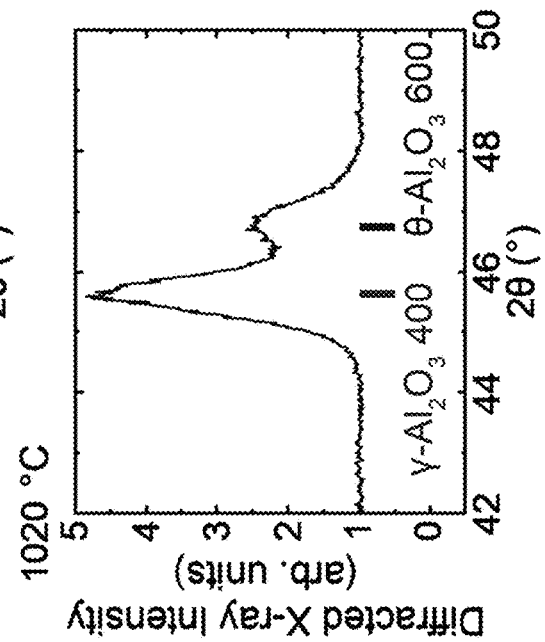
FIG. 6C shows intensity as a function of 2θ obtained by integrating 2.5°-wide range of χ angles near the γ-Al$_2$O$_3$ 400 reflection.

The interplanar spacing of γ-Al$_2$O$_3$ in the plane parallel to the surface was measured using the γ-Al$_2$O$_3$ 400 family of x-ray reflections. Diagrams of the reciprocal space of γ-Al$_2$O$_3$ and θ-Al$_2$O$_3$ and the x-ray scattering geometry are shown in FIG. 6A. The schematic in FIG. 6A also includes the α-Al$_2$O$_3$ 11$\bar{2}$3 reflection that serves as a reference for the overall epitaxial relationship. The diffraction patterns in FIGS. 6A-6E were obtained by integrating the diffracted intensity while rotating the x-ray incident angle through a range spanning the Bragg conditions of the γ-Al$_2$O$_3$ 400 and θ-Al$_2$O$_3$ 600 reflections. The diffraction pattern and integrated intensity as a function of 2θ are shown in FIGS. 6B and 6C after heating to 800° C. and in FIGS. 6D and 6E after heating to 1020° C. The γ-Al$_2$O$_3$(400) interplanar spacing determined from the γ-Al$_2$O$_3$ 400 reflection was 1.98 Å.

The γ-Al$_2$O$_3$(111) and (400) interplanar spacings were not precisely consistent with cubic symmetry and thus indicate that the γ-Al$_2$O$_3$ layer was elastically distorted. Possible sources of elastic distortion include stress remaining after the relaxation of the large epitaxial mismatch between γ-Al$_2$O$_3$ and α-Al$_2$O$_3$. The hypothetical lattice parameter of undistorted cubic γ-Al$_2$O$_3$ can be determined based on the assumption that the remaining strain has biaxial symmetry. The interplanar spacing of a purely in-plane γ-Al$_2$O$_3$ 4$\bar{2}\bar{2}$ reflection was determined using the difference between the γ-Al$_2$O$_3$ 222 and 600 reflection vectors. Using the in-plane and out-of-plane interplanar spacings, it was found that the reflections were fit with a cubic γ-Al$_2$O$_3$ phase with lattice parameter 7.88 Å, in-plane strain 0.55%, and out-of-plane strain −0.39%. The calculations employed a Poisson ratio of 0.26 from the literature. (Tu, B. et al., *J. Am. Ceram. Soc.* 2014, 97, 2996-3003.) Varying the specific choice of the Poisson ratio over the entire reasonable range of possible values did not have a significant impact on the results.

Figure 6D:
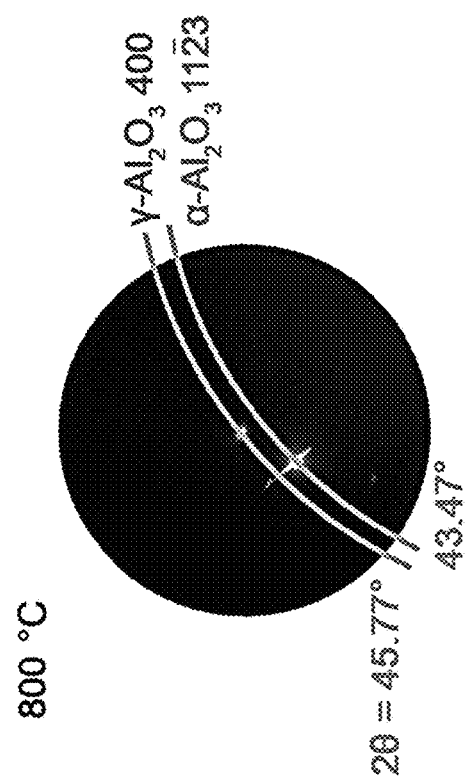
FIG. 6D shows an X-ray diffraction pattern recorded during a rocking scan after heating to 1020° C.
Figure 6E:
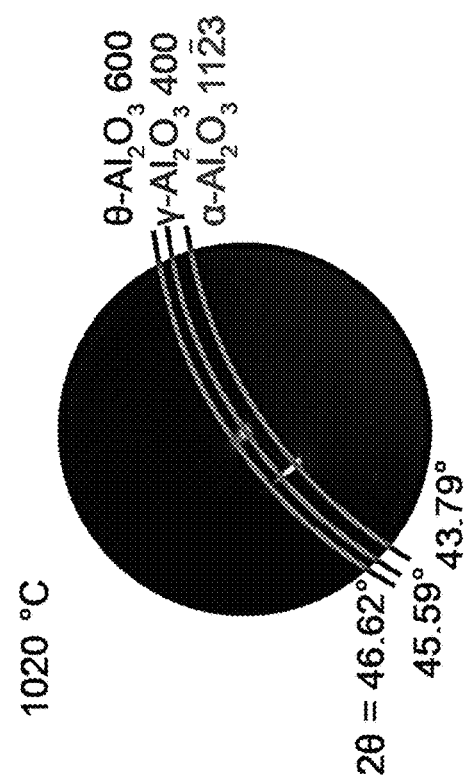
FIG. 6E shows intensity as a function of 2θ obtained by integrating the same range as FIG. 6C, exhibiting the γ-Al$_2$O$_3$ 400 and θ-Al$_2$O$_3$ 600 reflections.
Figures 7A, 7B:
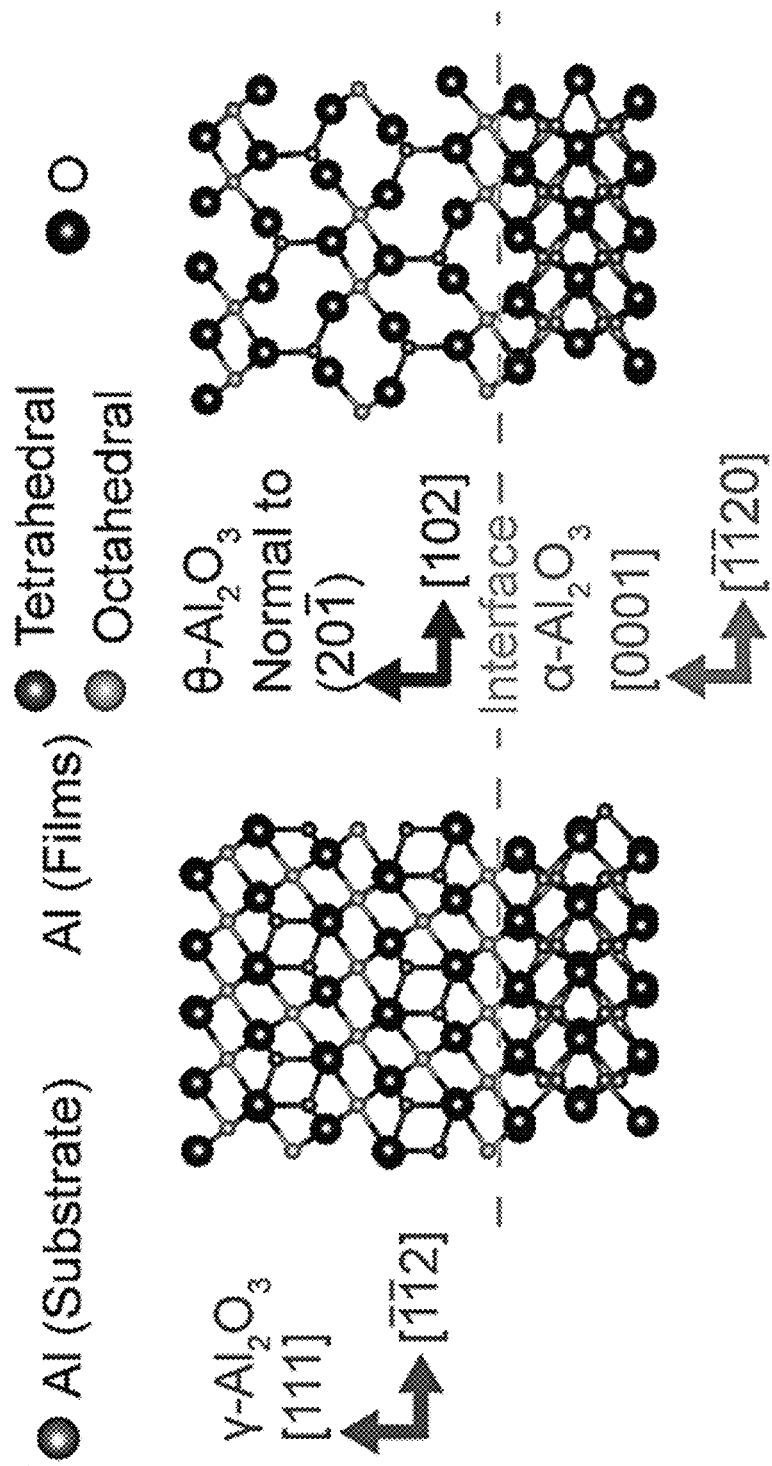
FIGS. 7A-7B show bonding configurations and epitaxial relationships at the interfaces of (FIG. 7A) epitaxial γ-Al$_2$O$_3$ on α-Al$_2$O$_3$, and (FIG. 7B) epitaxial θ-Al$_2$O$_3$ on α-Al$_2$O$_3$.

The orientations and contact planes of the epitaxial films were determined from the x-ray diffraction studies. In the θ/2θ scans in FIG. 5A, γ-Al$_2$O$_3$ 111 and θ-Al$_2$O$_3$ 20$\bar{1}$ reflections appeared along the normal direction of α-Al$_2$O$_3$ (0001) substrate, which indicates that the epitaxial relationship is such that the following planes were parallel: a (0001) 17 (111) 0 (20$\bar{1}$). The asymmetric reflections of γ-Al$_2$O$_3$ 400 and θ-Al$_2$O$_3$ 600 appeared in the same azimuthal angle with the same sample tilting as the 11$\bar{2}$3 reflection of α-Al$_2$O$_3$ substrate, as shown in FIG. 6D. The following in-plane directions are thus parallel: α [1$\bar{1}$00]‖γ[0$\bar{1}$1]‖θ[010]. The epitaxial relationship and the bonding configuration at the interfaces between the crystallized γ-Al$_2$O$_3$ and θ-Al$_2$O$_3$ layers and the α-Al$_2$O$_3$ substrate are schematically shown in FIGS. 7A and 7B, respectively. Al atoms at tetrahedral and octahedral sites are shaded differently to emphasize the bonding structures and the epitaxial relationships at the interfaces of two phases. The drawings were constructed based on the assumption that the oxygen sublattices were matched at the interfaces.

The azimuthal arrangement of the γ-Al$_2$O$_3$ reflections indicates that the γ-Al$_2$O$_3$ layer formed with two structural variants. In general, rotation around the [111] direction of a cubic crystal should yield reflections with three-fold azimuthal symmetry. Azimuthal rotation of the films produced by SPE, however, revealed six intensity maxima, which indicates that two domains were present in the γ-Al$_2$O$_3$ layer. The two domains are related by a 1800 rotation around [111], which is consistent with the two possible ways that the FCC stacking sequence of the oxygen layers can be continued from the α-Al$_2$O$_3$ substrate into the γ-Al$_2$O$_3$ layer.

Sites of Al Vacancies in γ-Al$_2$O$_3$ and Variation of the γ-Al$_2$O$_3$ Lattice Parameter The conventional unit cell of the spinel structure on which γ-Al$_2$O$_3$ is based includes 32 oxygen-ion sites and 24 sites for cations, consisting of 16 sites with octahedral symmetry and 8 with tetrahedral symmetry. The Al$_2$O$_3$ composition requires that each conventional unit cell includes only 64/3≈21.33 Al cations sties and that the remaining 8/3≈2.67 cation sites be vacant. (Cai, S.-H. et al., Phys. Rev. B 2003, 67, 224104.) The hypothetical structures in which Al vacancies occupy only octahedral sites or only tetrahedral sites are shown in FIGS. 8A and 8B, respectively.

The lattice parameter of γ-Al$_2$O$_3$ varies depending on the sites of Al vacancies. The lattice parameter γ-Al$_2$O$_3$ determined from the X-ray analysis can thus be used to determine the sites of Al vacancies. The γ-Al$_2$O$_3$ lattice parameter ranged from 7.84 Å when Al vacancies were at tetrahedral sites to 7.95 Å when Al vacancies were at octahedral sites. (Eberhart, J.-P. Bull. Minéral. 1963, 86, 213-251; Zhou, R.-S. et al., Acta Cryst. B 1991, 47, 617-630.) A linear interpolation between these cases indicates that the experimentally observed lattice parameter arose when 64% of the Al vacancies sat on sites with tetrahedral coordination. An example of a distribution of vacancies producing a lattice parameter matching the experimentally observed value is shown in FIG. 8C. Five of the eight of the Al vacancies in FIG. 8C were at tetrahedral sites, close to the value of 64% matching the experimental lattice parameter.

The structure produced by the MD simulation also provides insight into the positions of Al vacancies within the partially occupied spinel unit cell. The coordination number distribution of epitaxial γ-Al$_2$O$_3$ was computed using positions obtained in a 100 ps MD relaxation of structures incorporating only octahedral or only tetrahedral vacancy sites. When the vacancies were only at octahedral sites, the percentage of Al atoms with octahedral coordination was 62.5%. With vacancies only at tetrahedral sites, the same percentage was 75%. The percentage of Al atoms with octahedral coordination for the epitaxial γ-Al$_2$O$_3$ produced by MD simulation was 70%, which implies that 78% of the vacancies were at tetrahedral sites by comparing to the two extreme percentages of the occupation sites.

The variation of the lattice parameter of the γ-Al$_2$O$_3$ led to the intriguing possibility that the distribution of vacancy sites was adopted during epitaxy to select a lattice parameter that minimized the elastic energy. The γ-Al$_2$O$_3$ on α-Al$_2$O$_3$ selected a configuration in the structural mismatch between epitaxial γ-Al$_2$O$_3$ and substrate α-Al$_2$O$_3$ that was reduced by favoring the vacancies on tetrahedral sites.

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" can mean only one or can mean "one or more." Embodiments consistent with both constructions are covered.

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. An Al$_2$O$_3$ film comprising at least 70 mol. % γ-Al$_2$O$_3$, the Al$_2$O$_3$ film having an x-ray rocking curve for an Al$_2$O$_3$ 222 reflection with a full width at half maximum of 0.06° or lower, a film thickness of less than 200 nm, and a lateral cross-sectional area of at least 1 cm$^2$.

2. The method of claim 1, wherein the Al$_2$O$_3$ film thickness is 10 nm or less.

3. The Al$_2$O$_3$ film of claim 1, comprising at least 90 mol. % γ-Al$_2$O$_3$.

4. The Al$_2$O$_3$ film of claim 1, wherein the full width at half maximum of the x-ray rocking curve for the Al$_2$O$_3$ 222 reflection is in the range from 0.010 to 0.060 and the film thickness is in the range from 2 nm to 100 nm.

5. The Al$_2$O$_3$ film of claim 4, comprising at least 90 mol. % γ-Al$_2$O$_3$.

6. The Al$_2$O$_3$ film of claim 1, wherein the Al$_2$O$_3$ film comprises only a single γ-Al$_2$O$_3$ domain.

7. The Al$_2$O$_3$ film of claim 1, wherein the Al$_2$O$_3$ film is disposed on an α-Al$_2$O$_3$ substrate.

8. The Al$_2$O$_3$ film of claim 7, wherein the Al$_2$O$_3$ film is disposed on a (0001) surface of the α-Al$_2$O$_3$ substrate.

9. The Al$_2$O$_3$ film of claim 7, wherein the α-Al$_2$O$_3$ substrate is a miscut substrate and the Al$_2$O$_3$ film comprises only a single γ-Al$_2$O$_3$ domain.

10. A heterostructure comprising:
an Al$_2$O$_3$ film comprising at least 70 mol. % γ-Al$_2$O$_3$, the Al$_2$O$_3$ film having an x-ray rocking curve for an Al$_2$O$_3$ 222 reflection with a full width at half maximum of 0.06° or lower, a film thickness of less than 200 nm, and a lateral cross-sectional area of at least 1 cm$^2$; and
an epitaxial overlayer on the Al$_2$O$_3$ film, the epitaxial overlayer comprising an inorganic oxide having a cubic crystal structure or a hexagonal crystal structure.

11. The heterostructure of claim 10, wherein the Al$_2$O$_3$ film thickness is 10 nm or less.

12. The heterostructure of claim 10, wherein the Al$_2$O$_3$ film comprises at least 90 mol. % 7-Al$_2$O$_3$.

13. The heterostructure of claim 10, wherein the full width at half maximum of the x-ray rocking curve for the Al$_2$O$_3$ 222 reflection is in the range from 0.01° to 0.06° and the film thickness is in the range from 2 nm to 100 nm.

14. The heterostructure of claim 13, wherein the Al$_2$O$_3$ film comprises at least 90 mol. % 7-Al$_2$O$_3$.

15. The heterostructure of claim 10, wherein the $Al_2O_3$ film comprises only a single 7-$Al_2O_3$ domain.

16. The heterostructure of claim 10, further comprising an $\alpha$-$Al_2O_3$ substrate supporting the $Al_2O_3$ film.

17. The heterostructure of claim 16, wherein the $Al_2O_3$ film is disposed on a (0001) surface of the $\alpha$-$Al_2O_3$ substrate.

18. The heterostructure of claim 16, wherein the $\alpha$-$Al_2O_3$ substrate is a miscut substrate and the $Al_2O_3$ film comprises only a single 7-$Al_2O_3$ domain.

19. The heterostructure of claim 10, wherein the inorganic oxide is $Pb[Zr_xTi_{1-x}]O_3$, $BiFeO_3$, $KTaO_3$, $SrVO_3$, or a garnet having the general chemical formula $X_3Z_2(TO_4)_3$, where X, Y, and T are independently selected from metal or metalloid elements.

\* \* \* \* \*

UNITED STATES PATENT AND TRADEMARK OFFICE
CERTIFICATE OF CORRECTION

PATENT NO. : 11,879,185 B2
APPLICATION NO. : 17/544298
DATED : January 23, 2024
INVENTOR(S) : Chang-Beom Eom et al.

It is certified that error appears in the above-identified patent and that said Letters Patent is hereby corrected as shown below:

In the Specification

Column 3, Line 53:
Delete the phrase "$\gamma$-$Al_2O_3$" and replace with --$\theta$-$Al_2O_3$--.

Column 4, Line 2:
Delete the phrase "$\gamma$-$Al_2O_3$" and replace with --$\theta$-$Al_2O_3$--.

Column 4, Line 3:
Delete the phrase "$\gamma$-$Al_2O_3$" and replace with --$\theta$-$Al_2O_3$--.

Column 4, Line 12:
Delete the phrase "$\gamma$-$Al_2O_3$" and replace with --$\theta$-$Al_2O_3$--.

Column 4, Line 13:
Delete the phrase "$\gamma$-$Al_2O_3$" and replace with --$\theta$-$Al_2O_3$--.

Column 4, Line 19:
Delete the phrase "$\gamma$-$Al_2O_3$ and $\gamma$-$Al_2O_3$" and replace with --$\gamma$-$Al_2O_3$ and $\theta$-$Al_2O_3$--.

Column 4, Line 20:
Delete the phrase "$\gamma$-$Al_2O_3$" and replace with --$\theta$-$Al_2O_3$--.

Column 4, Line 23:
Delete the phrase "$\gamma$-$Al_2O_3$" and replace with --$\theta$-$Al_2O_3$--.

Column 6, Line 20:
Delete the phrase "1 cm 2" and replace with --1 $cm^2$--.

Signed and Sealed this
Eleventh Day of June, 2024

Katherine Kelly Vidal
*Director of the United States Patent and Trademark Office*

Column 9, Line 15:
Delete the phrase "Cu Kai" and replace with --Cu K$\alpha_1$--.

Column 10, Line 62:
Delete the phrase "$\gamma$-Al$_2$O$_3$ and $\gamma$-Al$_2$O$_3$" and replace with --$\gamma$-Al$_2$O$_3$ and $\theta$-Al$_2$O$_3$--.

Column 10, Line 66:
Delete the phrase "0 atoms" and replace with --O atoms--.

Column 11, Line 1:
Delete the phrase "Al-0" and replace with --Al-O--.

Column 11, Lines 3-4:
Delete the phrase "An 0 atom" and replace with --An O atom--.

Column 11, Line 33:
Delete the phrase "$\gamma$-Al$_2$O$_3$" and replace with --$\theta$-Al$_2$O$_3$--.

Column 11, Line 40:
Delete the phrase "$\gamma$-Al$_2$O$_3$ 600" and replace with --$\theta$-Al$_2$O$_3$ 600--.

Column 11, Line 43:
Delete the phrase "$\gamma$-Al$_2$O$_3$" and replace with --$\theta$-Al$_2$O$_3$--.

Column 11, Line 49:
Delete the phrase "$\gamma$-Al$_2$O$_3$ and $\gamma$-Al$_2$O$_3$" and replace with --$\gamma$-Al$_2$O$_3$ and $\theta$-Al$_2$O$_3$--.

Column 12, Line 5:
Delete the phrase "$\gamma$-Al$_2$O$_3$" and replace with --$\theta$-Al$_2$O$_3$--.

Column 12, Line 6:
Delete the phrase "$\gamma$-Al$_2$O$_3$ and $\gamma$-Al$_2$O$_3$" and replace with --$\gamma$-Al$_2$O$_3$ and $\theta$-Al$_2$O$_3$--.

Column 12, Line 18:
Delete the phrase "$\gamma$-Al$_2$O$_3$ and $\gamma$-Al$_2$O$_3$" and replace with --$\gamma$-Al$_2$O$_3$ and $\theta$-Al$_2$O$_3$--.

Column 12, Line 22:
Delete the phrase "$\gamma$-Al$_2$O$_3$" and replace with --$\theta$-Al$_2$O$_3$--.

Column 12, Line 26:
Delete the phrase "$\gamma$-Al$_2$O$_3$" and replace with --$\theta$-Al$_2$O$_3$--.

Column 12, Line 29:
Delete the phrase "$\gamma$-Al$_2$O$_3$" and replace with --$\theta$-Al$_2$O$_3$--.

CERTIFICATE OF CORRECTION (continued)
U.S. Pat. No. 11,879,185 B2

Column 12, Line 42:
Delete the phrase "O—Al$_2$O$_3$" and replace with --θ-Al$_2$O$_3$--.

Column 12, Line 44:
Delete the phrase "γ-Al$_2$O$_3$ and γ-Al$_2$O$_3$" and replace with --γ-Al$_2$O$_3$ and θ-Al$_2$O$_3$--.

Column 13, Line 14:
Delete the phrase "γ-Al$_2$O$_3$" and replace with --θ-Al$_2$O$_3$--.

Column 13, Line 25:
Delete the phrase "γ-Al$_2$O$_3$" and replace with --θ-Al$_2$O$_3$--.

Column 13, Line 28:
Delete the phrase "γ-Al$_2$O$_3$" and replace with --θ-Al$_2$O$_3$--.

Column 13, Line 30:
Delete the phrase "γ-Al$_2$O$_3$" and replace with --θ-Al$_2$O$_3$--.

Column 13, Line 31:
Delete the phrase "γ-Al$_2$O$_3$ 202 and 401" and replace with --θ-Al$_2$O$_3$ $20\bar{2}$ and $40\bar{1}$--.

Column 13, Line 34:
Delete the phrase "γ-Al$_2$O$_3$" and replace with --θ-Al$_2$O$_3$--.

Column 13, Line 43:
Delete the phrase "γ-Al$_2$O$_3$" and replace with --θ-Al$_2$O$_3$--.

Column 13, Line 44:
Delete the phrase "γ-Al$_2$O$_3$" and replace with --θ-Al$_2$O$_3$--.

Column 13, Line 44:
Delete the phrase "202 and 401" and replace with --$20\bar{2}$ and $40\bar{1}$--.

Column 13, Line 45:
Delete the phrase "γ-Al$_2$O$_3$" and replace with --θ-Al$_2$O$_3$--.

Column 13, Line 50:
Delete the phrase "20" and replace with --2θ--.

Column 13, Line 53:
Delete the phrase "202 and 401" and replace with --$20\bar{2}$ and $40\bar{1}$--.

Column 13, Line 55:
Delete the phrase "20" and replace with --2θ--.

CERTIFICATE OF CORRECTION (continued)
U.S. Pat. No. 11,879,185 B2

Column 13, Line 58:
Delete the phrase "2θ angle of the 712 reflection." and replace with --2θ angle of the $7\bar{1}\bar{2}$ reflection.--.

Column 13, Line 64:
Delete the phrase "γ-Al$_2$O$_3$ was γ-Al$_2$O$_3$" and replace with --γ-Al$_2$O$_3$ was θ-Al$_2$O$_3$--.

Column 14, Line 5:
Delete the phrase "γ-Al$_2$O$_3$ and γ-Al$_2$O$_3$" and replace with --γ-Al$_2$O$_3$ and θ-Al$_2$O$_3$--.

Column 14, Line 17:
Delete the phrase "0.030" and replace with --0.03°--.

Column 14, Lines 61-62:
Delete the phrase "a (0001) 17 (111) 0 (20$\bar{1}$)." and replace with --α (0001) ∥ γ (111) ∥ θ (20$\bar{1}$).--.

Column 15, Line 17:
Delete the phrase "1800" and replace with --180°--.

In the Claims

Claim 4, Column 16, Line 36:
Delete the phrase "0.010 to 0.060" and replace with --0.01° to 0.06°--.

Claim 12, Column 16, Line 61:
Delete the phrase "7-Al$_2$O$_3$." and replace with --γ-Al$_2$O$_3$.--.

Claim 14, Column 16, Line 67:
Delete the phrase "7-Al$_2$O$_3$." and replace with --γ-Al$_2$O$_3$.--.

Claim 15, Column 17, Line 2:
Delete the phrase "7-Al$_2$O$_3$" and replace with --γ-Al$_2$O$_3$--.

Claim 18, Column 17, Line 10:
Delete the phrase "7-Al$_2$O$_3$" and replace with --γ-Al$_2$O$_3$--.